United States Patent
Abe et al.

(10) Patent No.: US 10,163,922 B2
(45) Date of Patent: Dec. 25, 2018

(54) SEMICONDUCTOR DEVICE AND METHOD OF MANUFACTURING THE SEMICONDUCTOR DEVICE

(71) Applicant: RENESAS ELECTRONICS CORPORATION, Tokyo (JP)

(72) Inventors: Shinichiro Abe, Tokyo (JP); Masaaki Shinohara, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 5 days.

(21) Appl. No.: 15/468,673

(22) Filed: Mar. 24, 2017

(65) Prior Publication Data
US 2017/0278854 A1  Sep. 28, 2017

(30) Foreign Application Priority Data
Mar. 28, 2016 (JP) ................... 2016-063877

(51) Int. Cl.
H01L 29/792 (2006.01)
H01L 27/1157 (2017.01)
H01L 29/66 (2006.01)

(52) U.S. Cl.
CPC .... H01L 27/1157 (2013.01); H01L 29/66833 (2013.01); H01L 29/792 (2013.01)

(58) Field of Classification Search
None
See application file for complete search history.

(56) References Cited

U.S. PATENT DOCUMENTS

| 6,806,517 B2* | 10/2004 | Kim ................. H01L 21/28114 257/204 |
| 7,829,938 B2 | 11/2010 | Bhattacharyya |
| 2006/0086970 A1* | 4/2006 | Kim ................. H01L 21/28282 257/321 |

FOREIGN PATENT DOCUMENTS

JP  2004-282083 A  10/2004
JP  2009-501449 A  1/2009

* cited by examiner

*Primary Examiner* — Calvin Choi
(74) *Attorney, Agent, or Firm* — McDermott Will & Emery LLP

(57) ABSTRACT

In a MONOS memory, withstand voltage is increased between a control gate electrode over an ONO film having a charge accumulating part and a semiconductor substrate. When a silicon film is processed to form a control gate electrode, dry etching is performed for a relatively long time, thereby a recess is formed in a sidewall of the control gate electrode. Subsequently, the control gate electrode is subjected to dry oxidation treatment to form an insulating film on the sidewall of the control gate electrode including the recess, thereby an end of the bottom of the control gate electrode is separated from an end of the top of the ONO film.

15 Claims, 26 Drawing Sheets

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2016-063877 filed on Mar. 28, 2016 including the specification, drawings and abstract is incorporated herein by reference in its entirety.

BACKGROUND

The present invention relates to a semiconductor device and a method of manufacturing the semiconductor device. For example, the invention can be used for manufacturing of a semiconductor device including a nonvolatile memory.

An electrically erasable and programmable read only memory (EEPROM) is widely used as an electrically writable and erasable nonvolatile semiconductor storage device. Such a storage device includes a conductive floating gate electrode surrounded by an oxide film or a trapping insulating film below a gate electrode of MISFET, and reads storage information as a threshold of a transistor while assuming a charge accumulating state at the floating gate or the trapping insulating film as the storage information.

The trapping insulating film refers to a charge-accumulable insulating film, and exemplarily includes a silicon nitride film. A threshold of the MISFET is shifted by injecting and emitting charge into/from such a charge accumulating region to allow the MISFET to operate as a storage device. The nonvolatile semiconductor storage device using the trapping insulating film includes a single-gate cell using a metal oxide nitride oxide semiconductor (MONOS).

Japanese Unexamined Patent Application Publication No. 2004-282083 describes that a memory cell having a wedge-shaped oxide nitride oxide (ONO) film, part of which protrudes outward compared with a sidewall of a gate electrode, is provided below the gate electrode.

Japanese Unexamined Patent Application Publication (Translation of PCT Application) No. 2009-501449 describes a silicon oxide nitride oxide semiconductor (SONOS) nonvolatile memory device, in which a control gate electrode having a width narrower than a stacked film is formed on the stacked film, the stacked film including a tunnel layer, a trap layer, and a charge blocking layer formed in this order on a substrate.

SUMMARY

In the memory cell having a control gate electrode that is formed on a semiconductor substrate with the ONO film in between, dielectric-film breakdown easily occurs due to rewriting stress, and thus an increase in withstand voltage between the semiconductor substrate and the control gate electrode is required. In a possible method, wet oxidation is performed after forming the ONO film and the control gate electrode, thereby thickness of an insulating film between an end of a charge accumulating film of the ONO film and an end of the control gate electrode is increased, i.e., a bird's beak is formed. In such a case, however, thickness of the insulating film between the control gate electrode and the semiconductor substrate increases, leading to deterioration in characteristics of the memory cell.

In addition, the semiconductor substrate receives heat load in the wet oxidation step, which disadvantageously varies characteristics of another field effect transistor or a resistance element integrally mounted on the semiconductor substrate.

Other issues and novel features will be clarified from the description of this specification and the accompanying drawings.

A typical one of embodiments disclosed in this application is briefly summarized as follows.

A method of manufacturing a semiconductor device of one embodiment includes a step of forming a control gate electrode on a semiconductor substrate with an ONO film in between, in which a portion of a sidewall of the control gate electrode, the portion being in contact with the top of the ONO film, has a reversely tapered shape.

A semiconductor device of another embodiment is a MONOS memory having a control gate electrode formed on a semiconductor substrate with an ONO film in between, in which a sidewall of the control gate electrode has a constriction, and the bottom of the control gate electrode is separated from an end of the top of the ONO film.

According to the one embodiment, reliability of the semiconductor device can be improved.

DETAILED DESCRIPTION

Figure 1:
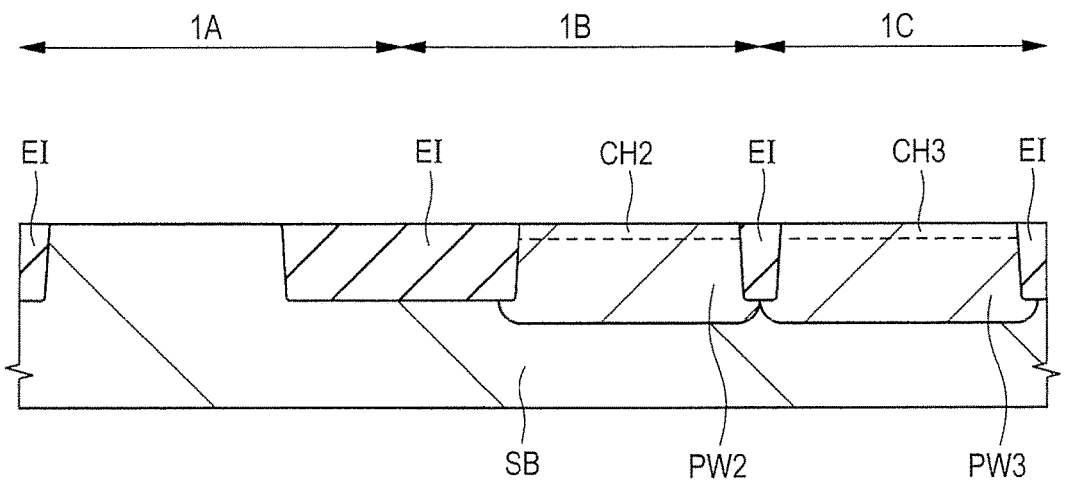
FIG. 1 is a sectional view of a semiconductor device of a first embodiment during a manufacturing process of the semiconductor device.

Hereinafter, some embodiments are described in detail with reference to the accompanying drawings. In all drawings for explaining the following embodiments, components having the same function are designated by the same numeral, and duplicated description is omitted. In the following embodiments, the same or similar portion is not repeatedly described in principle except for a particularly required case.

First Embodiment

The semiconductor devices of the following embodiments including the first embodiment are each a semiconductor device including a nonvolatile memory (a nonvolatile storage element, a flash memory, or a nonvolatile semiconductor storage device), a low-withstand-voltage transistor, and a high-withstand-voltage transistor. In the following embodiments including the first embodiment, the nonvolatile memory is described with a memory cell based on an n-channel metal insulator semiconductor field effect transistor (MISFET).

In the following embodiments including the first embodiment, polarity (polarity of an applied voltage for each of write, erase, and read, and polarity of a carrier) is shown to describe operation of a memory cell based on the n-channel MIS field effect transistor (MISFET). For a memory cell based on a p-channel MISFET, the same operation is in principle provided by inverting polarity of any of applied potential, a conductivity type of carrier, and the like.

Method of Manufacturing Semiconductor Device

A method of manufacturing the semiconductor device of the first embodiment is now described with FIGS. 1 to 17. FIGS. 1 to 17 are each a sectional view of the semiconductor device of the first embodiment during a manufacturing process of the semiconductor device. Each of FIGS. 1 to 5, 9, 11, 12, and 15 to 17 illustrates sections of a memory cell region 1A, a low-withstand-voltage transistor region 1B, and a high-withstand-voltage transistor region 1C in this order from the left side to the right side of each drawing. The memory cell region 1A, the low-withstand-voltage transistor region 1B, and the high-withstand-voltage transistor region 1C are arranged along a main surface of a semiconductor substrate. In other words, the main surface of the semiconductor substrate has the memory cell region 1A, the low-withstand-voltage transistor region 1B, and the high-withstand-voltage transistor region 1C.

Each of FIGS. 6 to 8, 10, 13, and 14 is a sectional view illustrating the memory cell region 1A in an enlarged manner. The low-withstand-voltage transistor region 1B and the high-withstand-voltage transistor region 1C may be collectively referred to as peripheral region.

The following description shows a mode where a memory cell of the nonvolatile memory is formed in the memory cell region 1A, a low-withstand MISFET is formed in the low-withstand-voltage transistor region 1B, and a high-withstand MISFET is formed in the high-withstand-voltage transistor region 1C. Hereinafter, the memory cell of the nonvolatile memory may be simply referred to as nonvolatile memory cell.

Both of an n-channel MISFET and a p-channel MISFET, i.e., a complementary metal insulator semiconductor (CMIS) FET may be formed in the low-withstand-voltage transistor region 1B or the high-withstand-voltage transistor region 1C, for example.

In a manufacturing process of the semiconductor device, first, as illustrated in FIG. 1, a semiconductor substrate (semiconductor wafer) SB is provided, the semiconductor substrate including p single-crystal silicon (Si) having a specific resistance of about 1 to 10 $\Omega \cdot cm$, for example.

Subsequently, a plurality of trenches are formed in the main surface of the semiconductor substrate SB, and the inside of each trench is filled with a silicon oxide film to form an element isolating region EI including the silicon oxide film. Although the element isolating region EI has a shallow trench isolation (STI) structure, the element isolating region EI may be formed by a local oxidation of silicon (LOCOS) process.

The element isolating region EI is provided between any two of the memory cell region 1A, the low-withstand-voltage transistor region 1B, and the high-withstand-voltage transistor region 1C. The element isolating region EI is provided so as to surround a region in which each of the memory cell region 1A, the low-withstand-voltage transistor region 1B, and the high-withstand-voltage transistor region 1C is formed, i.e., surround an active region in planar view. In other words, the element isolating region EI defines a layout of the active region.

Subsequently, wells PW2 and PW3 as p semiconductor regions are formed using a photolithography technique and an ion implantation process in the main surface of a semiconductor substrate SB in the low-withstand-voltage transistor region 1B and in such a main surface in the high-withstand-voltage transistor region 1C, respectively. The wells PW2 and PW3 are each formed by implanting a p impurity (for example, boron (B)) into the main surface of the semiconductor substrate SB at a relatively low concentration. Each of the wells PW2 and PW3 has a depth deeper than the element isolating region EI. The wells PW2 and PW3 are formed in different ion implantation steps with a photolithography technique so as to have different impurity concentrations.

Subsequently, an n impurity (for example, arsenic (As) or phosphorous (P)) is implanted using a photolithography technique and an ion implantation process into the main surface of the semiconductor substrate SB in each of the low-withstand-voltage transistor region 1B and the high-withstand-voltage transistor region 1C, thereby channel regions CH2 and CH3, each being a p impurity region, are formed. Each of the channel regions CH2 and CH3 has a depth shallower than the element isolating region EI, and is formed only in the vicinity of the main surface of the semiconductor substrate SB.

The channel regions CH2 and CH3 are formed in different ion implantation steps with a photolithography technique so as to have different impurity concentrations. Although the channel regions CH2 and CH3 are each formed by implanting the n impurity into the main surface of the semiconductor substrate SB, the concentration of the n impurity is low while the concentration of the p impurity of each of the wells PW2 and PW3 in the top of the semiconductor substrate SB is relatively high; hence, the semiconductor region configuring each of the channel regions CH2 and CH3 has a p conductivity type. FIG. 1 shows a bottom of each of the channel regions CH2 and CH3 by a broken line.

Figure 2:
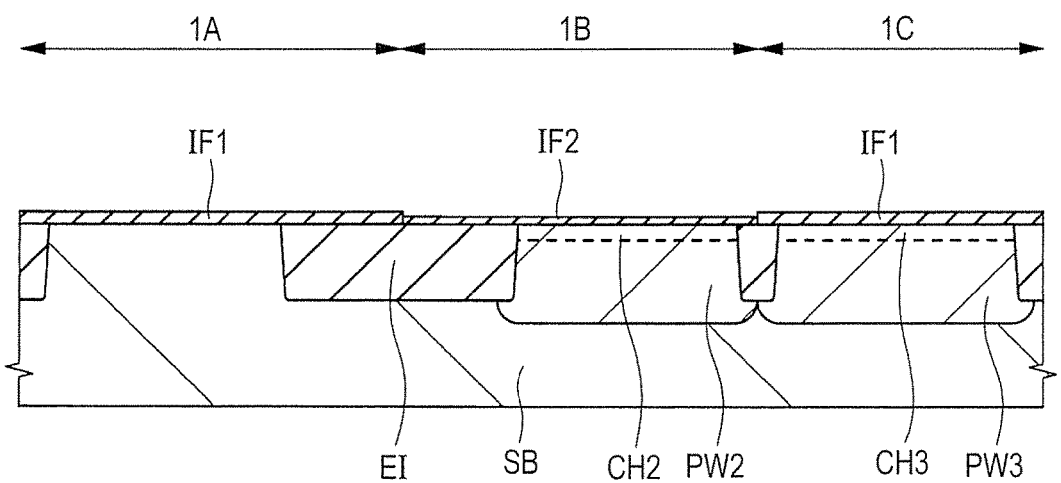
FIG. 2 is a sectional view of the semiconductor device during the manufacturing process following FIG. 1.

Subsequently, as illustrated in FIG. 2, an insulating film IF1 having a relatively large thickness is formed on the semiconductor substrate SB in each of the memory cell region 1A and the high-withstand-voltage transistor region 1C, while an insulating film IF2 having a relatively small thickness is formed in the low-withstand-voltage transistor region 1B. Since the insulating film IF1 in the high-withstand-voltage transistor region 1C serves as a gate insulating film of a high-withstand-voltage transistor to be formed later, the insulating film IF1 must have withstand voltage characteristics of about 5 to 12 V. Hence, the insulating film IF1 must have a thickness of about 15 to 20 nm. The insulating film IF1 has a thickness of 16 nm, for example. The insulating film IF2 has a thickness smaller than the insulating film IF1.

When the two types of insulating films IF1 and IF2 having different thicknesses are thus separately formed, for example, the insulating film IF1 is first formed over the entire main surface of the semiconductor substrate SB, and then the insulating film IF1 is removed from the low-withstand-voltage transistor region 1B, and then the insulating film IF2 is formed in the low-withstand-voltage transistor region 1B.

The insulating films IF1 and IF2 each include a silicon oxide film, for example. The insulating film IF1 can be formed by a dry oxidation process, a wet oxidation process, or an in-situ steam generation (ISSG) oxidation process, for example. The insulating film IF1 may be formed by a chemical vapor deposition (CVD) process, for example. In such a case, the insulating film IF1 includes a tetra ethyl ortho silicate (TEOS) film or a high-temperature silicon dioxide (HTO) film, for example. The insulating film IF1 may be formed by a combination of one of the above-described oxidation processes and the CVD process. In such a case, for example, an insulating film 5 nm thick is first formed by the oxidation process, and then an insulating film 10 nm thick is deposited by the CVD process, thereby the insulating film IF1 having a stacked structure of such insulating films is formed. The insulating film IF2 can be formed by thermal oxidation, for example.

Figure 3:
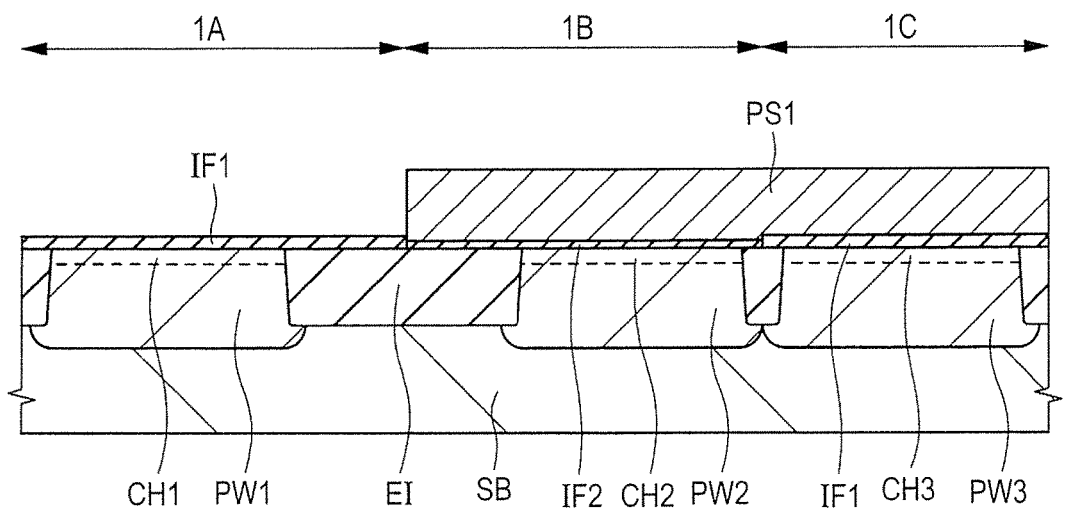
FIG. 3 is a sectional view of the semiconductor device during the manufacturing process following FIG. 2.

Subsequently, as illustrated in FIG. 3, a polysilicon film PS1 is formed over the entire main surface of the semiconductor substrate SB by a CVD process, for example. Consequently, the tops of the insulating films IF1 and IF2 are each covered by the polysilicon film PS1. Subsequently, the polysilicon film PS1 is removed from the memory cell region 1A with a photolithography technique and a dry etching process, thereby the top of the insulating film IF1 is exposed. The polysilicon film PS1 has a thickness of 150 nm, for example.

Figure 9:
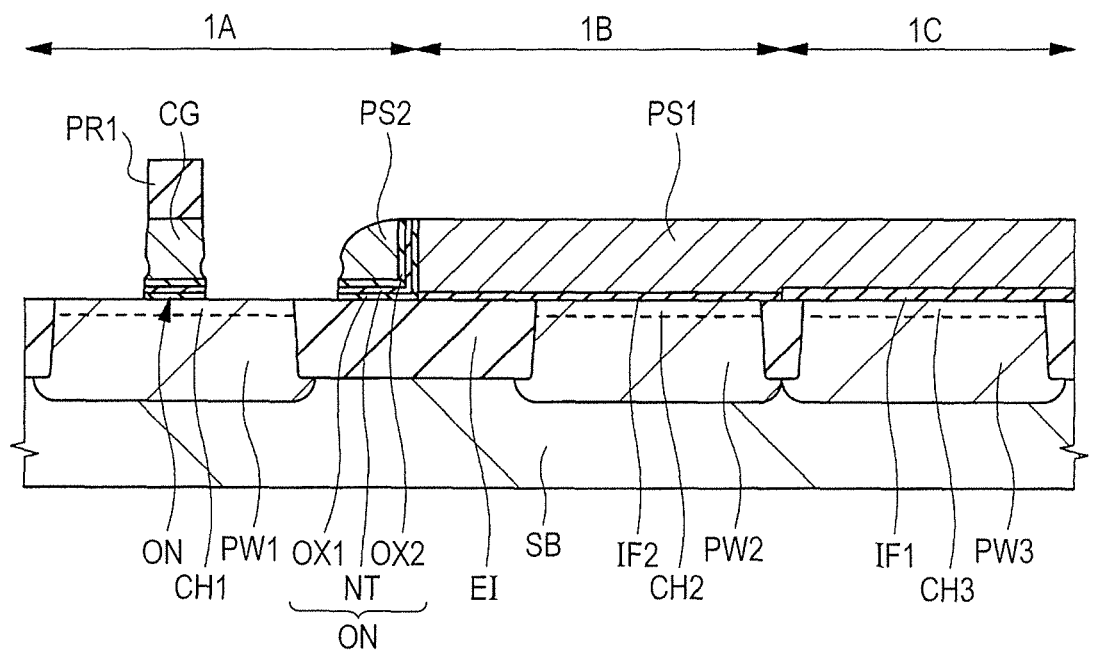
FIG. 9 is a sectional view of the semiconductor device during the manufacturing process following FIG. 8.
Figure 10:
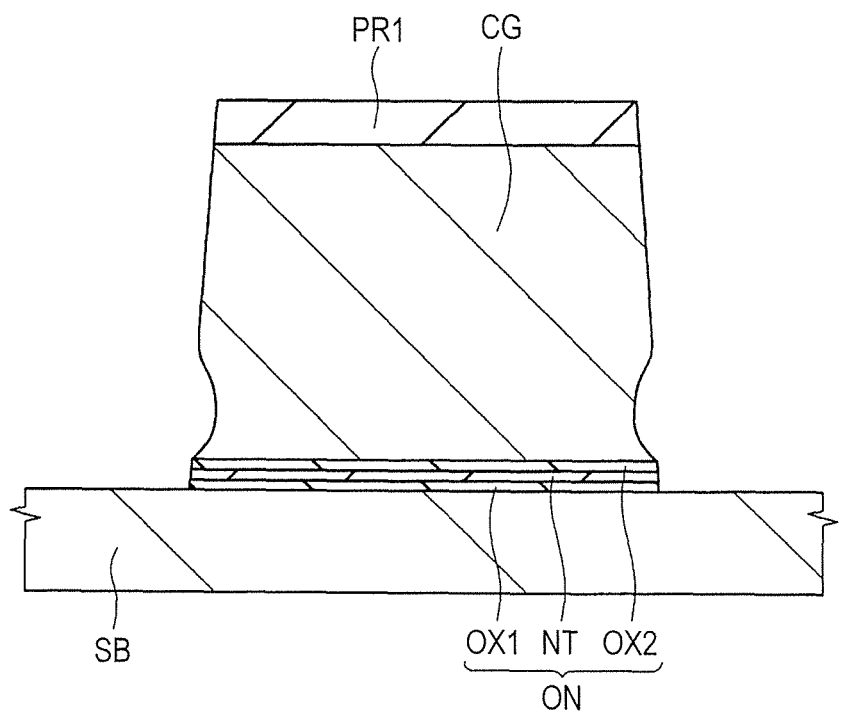
FIG. 10 is a sectional view of the semiconductor device during the manufacturing process following FIG. 8.

The polysilicon film PS1 having no impurity is formed, and then a step described later with FIGS. 9 and 10 is performed, and then an n impurity (for example, phosphorous (P)) is implanted into the polysilicon film PS1 by an ion implantation process. The polysilicon film PS1 may be formed as follows: An amorphous silicon film is first formed and is then poly-crystallized through subsequent heat treatment.

Subsequently, a well PW1 as a p semiconductor region is formed in the main surface of the semiconductor substrate SB in the memory cell region 1A. The well PW1 is formed by implanting a p impurity (for example, boron (B)) into the main surface of the semiconductor substrate SB at a relatively low concentration. The depth of the well PW1 is deeper than that of the element isolating region EI.

Subsequently, an n impurity (for example, arsenic (As) or phosphorous (P)) is implanted by an ion implantation process into the main surface of the semiconductor substrate SB in the memory cell region 1A, thereby a channel region CH1 is formed. The channel region CH1 has a depth shallower than the element isolating region EI, and is formed only in the vicinity of the main surface of the semiconductor substrate SB. FIG. 3 shows a bottom of the channel region CH1 by a broken line.

Figure 4:
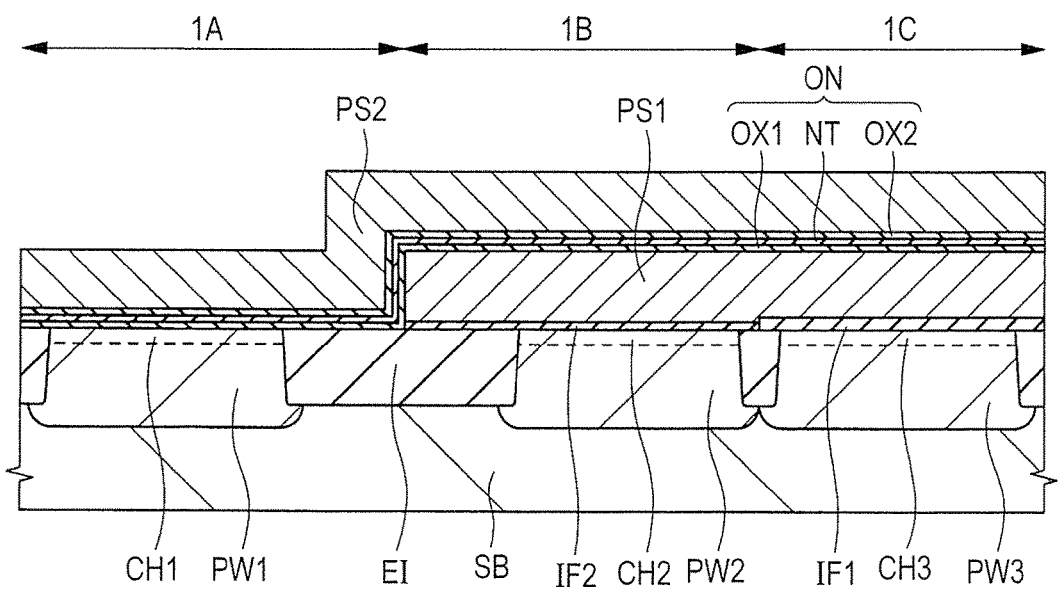
FIG. 4 is a sectional view of the semiconductor device during the manufacturing process following FIG. 3.

Subsequently, as illustrated in FIG. 4, the insulating film IF1 is removed from the memory cell region 1A with a photolithography technique and an etching process, thereby the main surface of the semiconductor substrate SB is exposed. Subsequently, an oxide-nitride-oxide (ONO) film ON, which is a stacked film for a gate insulating film of a memory transistor, is formed over the entire main surface of the semiconductor substrate SB. The ONO film ON covers the top of the semiconductor substrate SB in the memory cell region 1A, and covers a sidewall and the top of the polysilicon film PS1 in each of the low-withstand-voltage transistor region 1B and the high-withstand-voltage transistor region 1C. High heat is applied to the semiconductor substrate SB during formation of the ONO film ON.

The ONO film ON is an insulating film internally having a charge accumulating part. Specifically, the ONO film ON includes a stacked film of a silicon oxide film (bottom oxide film) OX1 formed on the semiconductor substrate SB, a silicon nitride film (charge accumulating part, charge accumulating film) NT formed on the silicon oxide film OX1, and a silicon oxide film (top oxide film) OX2 formed on the silicon nitride film NT.

The silicon oxide films OX1 and OX2 can each be formed by oxidation treatment (thermal oxidation treatment), a CVD process, or a combination of them. Such oxidation treatment may include ISSG oxidation. The silicon nitride film NT can be formed by a CVD process, for example. The thickness of each of the silicon oxide films OX1 and OX2 can be adjusted to, for example, about 2 to 10 nm. The thickness of the silicon nitride film NT can be adjusted to, for example, about 5 to 15 nm.

Subsequently, a polysilicon film PS2 is formed by, for example, a CVD process over the entire main surface of the semiconductor substrate SB so as to cover the top of the ONO film ON. Consequently, a sidewall and the top of the ONO film ON exposed in the memory cell region 1A are covered by the polysilicon film PS2. Subsequently, an n impurity (for example, phosphorous (P)) is implanted into the polysilicon film PS2 by the ion implantation process. Consequently, the polysilicon film PS2 is formed into an n semiconductor film. The polysilicon film PS2 may be formed as follows: An amorphous silicon film is first formed and is then poly-crystallized through subsequent heat treatment. The polysilicon film PS2 has a thickness of 150 nm, for example.

Figure 5:
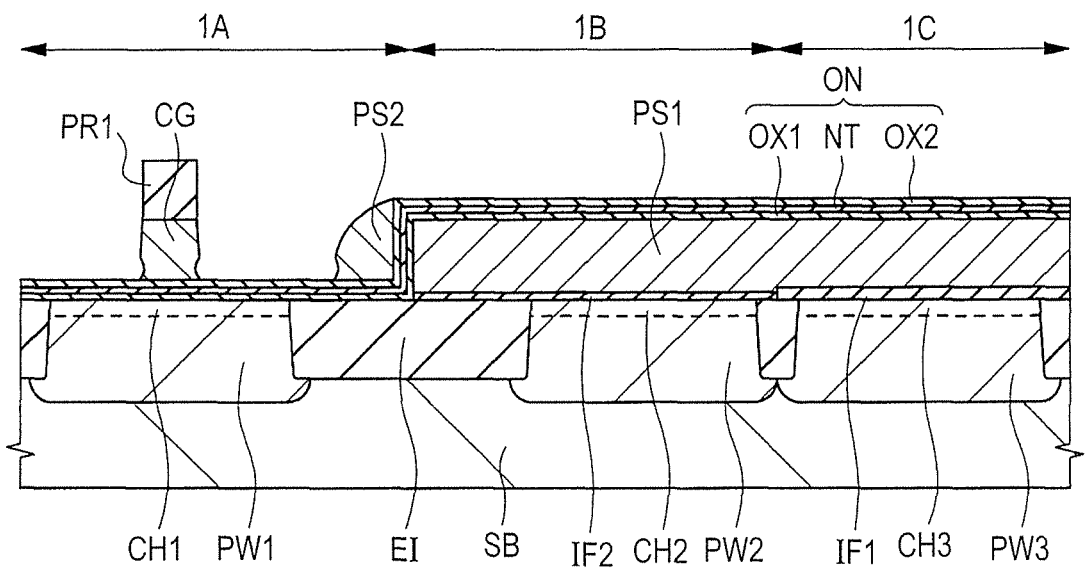
FIG. 5 is a sectional view of the semiconductor device during the manufacturing process following FIG. 4.

Subsequently, as illustrated in FIG. 5, a pattern including a photoresist film PR1 is formed in the memory cell region 1A with a photolithography technique, and then part of the polysilicon film PS2 is removed by dry etching. Consequently, the top of the ONO film ON is exposed. In such a processing step, the polysilicon film PS2 is subjected to anisotropic etching with the photoresist film PR1 as a mask, thereby the polysilicon film PS2 is removed from the low-withstand-voltage transistor region 1B and the high-withstand-voltage transistor region 1C. In addition, a control gate electrode CG including the polysilicon film PS2 is formed in the memory cell region 1A. A sidewall-like polysilicon film PS2 adjacently remains on the sidewall of the polysilicon film PS1 with the ONO film ON in between.

The resist pattern including the photoresist film PR1 is a mask pattern used as a mask for anisotropic etching. In the anisotropic etching, the polysilicon film PS2 is removed from a region exposed from the mask pattern.

Figure 6:
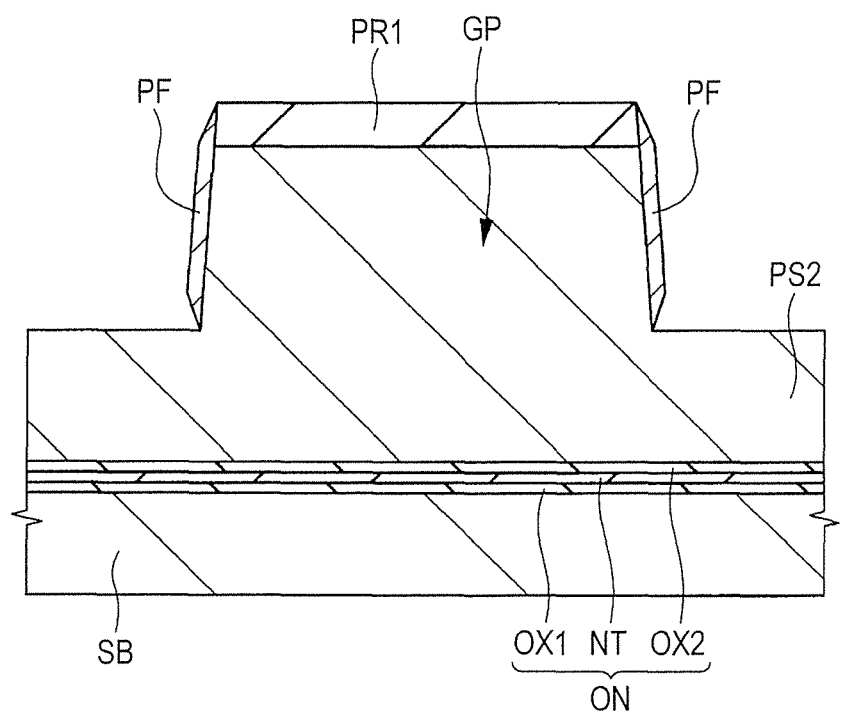
FIG. 6 is a sectional view of the semiconductor device during the manufacturing process following FIG. 4.
Figure 7:
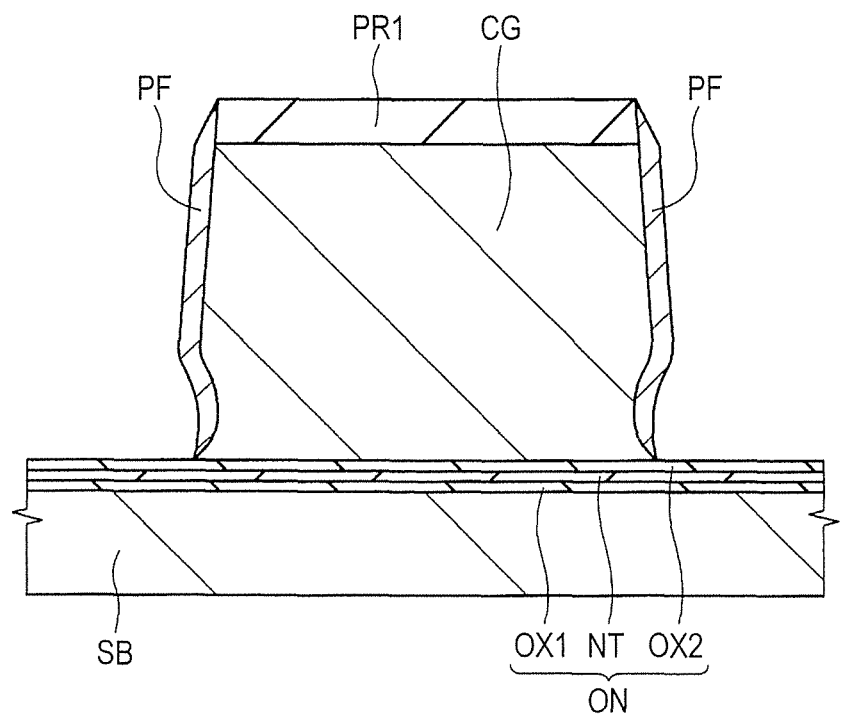
FIG. 7 is a sectional view of the semiconductor device during the manufacturing process following FIG. 6.
Figure 8:
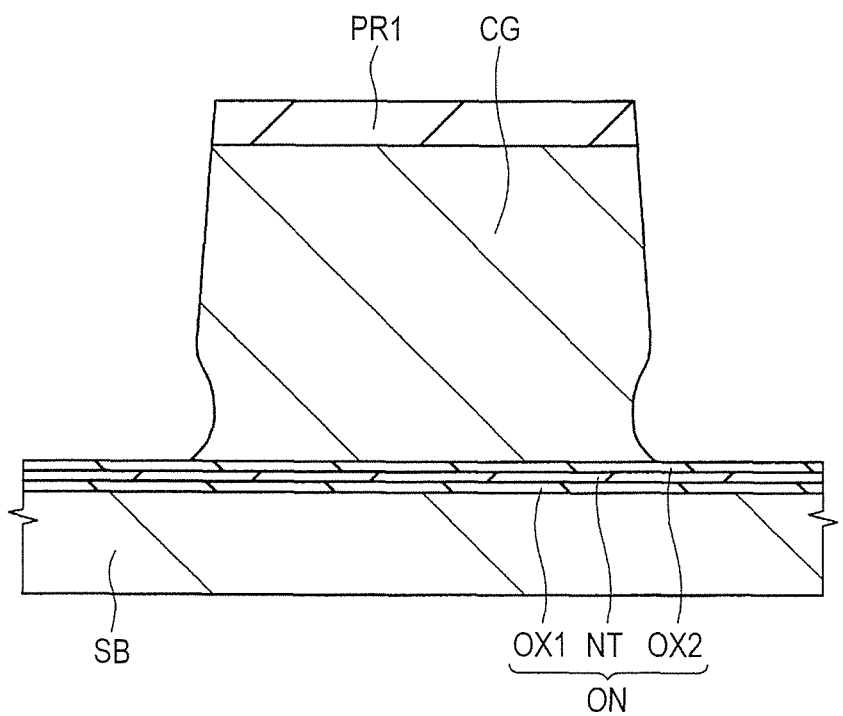
FIG. 8 is a sectional view of the semiconductor device during the manufacturing process following FIG. 7.

A control gate electrode CG having a constricted shape in its sidewall is formed through patterning by the anisotropic etching, which characterizes the first embodiment. A method of forming a constriction (recess) in the sidewall of the control gate electrode CG is now described with FIGS. 6 to 8. FIGS. 6 to 8 are each a sectional view illustrating the polysilicon film PS2 and its vicinity in the memory cell region in an enlarged manner 1A to describe the step described with FIG. 5 in detail.

After the step described with FIG. 4, as illustrated in FIG. 6, a resist pattern including the photoresist film PR1 is formed in the memory cell region 1A. Subsequently, the polysilicon film PS2 is removed up to an intermediate depth thereof by dry etching with the photoresist film PR1 as a mask. A sidewall of a gate pattern GP, which includes the polysilicon film PS2 located directly below the photoresist film PR1 and serves as the control gate electrode CG later, is processed possibly perpendicularly to remove most thickness of the polysilicon film PS2. In other words, such dry etching is a main etching among types of etching for formation of the control gate electrode CG to be described with FIGS. 6 to 8. FIGS. 6 to 8 omit illustration of the wells and the channel regions.

In the main etching, since the ONO film ON is not exposed, gas used in the etching requires no selectivity to the silicon oxide of the top of the ONO film ON. Such dry etching is therefore performed under a condition of low selectivity to the silicon oxide. In other words, the etching is performed under a low-pressure condition with a $SF_6/CH_3$ gas, for example.

During the etching step, a relatively strong protective film PF including a polymer, which corresponds to a residue produced at removal of the polysilicon film PS2, is formed so as to cover a sidewall of a stacked pattern including the gate pattern GP and the photoresist film PR1 over the gate pattern GP. That is, the protective film PF includes a material of the polysilicon film PS2 removed by the etching. Such etching proceeds while the protective film PF is formed on the sidewall of the gate pattern GP.

For dry etching being anisotropic etching, a sidewall of the pattern subjected to the etching is also somewhat eroded in a lateral direction by etching gas. It is therefore considered that an upper portion of the pattern shaped by dry etching is subjected to etching for a long time and thus recessed, thereby the sidewall of that pattern is greatly inclined, and a sectional shape of the pattern becomes a trapezoidal shape.

However, since the sidewall of the pattern formed by dry etching is then covered by the protective film PF as described above, that sidewall is not recessed by the etching. Consequently, the anisotropic etching allows the sidewall of the shaped pattern to be formed at an angle roughly perpendicular to the main surface of the semiconductor substrate SB. However, as illustrated in FIG. 6, the sidewall of the polysilicon film PS2 is not formed along a direction perpendicular to the main surface of the semiconductor substrate SB, but is formed to be slightly inclined to the other sidewall of the control gate electrode CG, for example. Specifically, while two angles are defined by the main surface of the semiconductor substrate SB directly below the gate pattern GP and the sidewall, a smaller one is smaller than 90°. In other words, the sidewall of the gate pattern GP has a tapered shape.

The tapered shape in this application means that a pattern formed on a substrate has a sidewall and a bottom, and when the bottom is along the main surface of the substrate, a smallest angle between angles defined by the sidewall and the bottom is larger than 0° and smaller than 90°. A reversely tapered shape in this application means that an angle defined by the sidewall and the bottom is larger than 90° and smaller than 180°.

A portion of the sidewall of the gate pattern GP is shaped from the polysilicon film PS2 during the main etching step and is still subjected to the main etching for a relatively short time before the main etching is finished. That is, a lower portion of the sidewall of the gate pattern GP is covered with the protective film PF having a relatively small thickness. This is because after the sidewall portion is shaped, the polymer for covering that sidewall portion is shaped for a short time.

The angle defined by a predetermined surface and another surface in this application refers to a smaller one between the two angles defined by the predetermined surface and another surface.

Subsequently, as illustrated in FIG. 7, dry etching is further performed, thereby the rest of the thickness of the polysilicon film PS2 is removed to expose the top of the ONO film ON. Specifically, dry etching called soft landing is performed. Consequently, the control gate electrode CG including the gate pattern GP and the polysilicon film PS2 under the gate pattern GP is formed. Such etching is performed under a condition of a high selectivity to silicon oxide in order to prevent an upper silicon oxide film OX2 from being removed. That is, etching is performed at a low-pressure condition using an $HBr/Cl_2/O_2$ gas-based etching gas, for example.

Etching is performed for a relatively long time to increase the etching amount. However, the etching has a selectivity to silicon oxide; hence, most of the silicon oxide film OX2 is not removed. Part of the sidewall of the control gate electrode CG is thus removed by the etching, and the part corresponds to the sidewall formed in the region that has not covered with the protective film PF in the main etching step described with FIG. 6. Specifically, part of the sidewall of the control gate electrode CG is shaped by the soft landing etching performed after the main etching so as to be greatly recessed, and is then covered by the protective film PF. In other words, a recess is formed in a portion at the lower side of the sidewall of the control gate electrode CG. The constriction (recess) as part of the sidewall of the control gate electrode CG is in contact with the top of the ONO film ON.

The constriction or recess formed in the sidewall in this application refers to a constricted shape of a sidewall of a predetermined pattern (for example, control gate electrode CG). When one sidewall of that pattern has a first portion and a second portion adjacent to each other, and when the first portion has a flat surface while the second portion includes a recess, the second portion is located close to the other sidewall of that pattern compared with the first portion.

While width in a gate length direction of the control gate electrode CG gradually increases from the top toward the bottom of the control gate electrode CG, since the recess (constricted portion) is formed from a predetermined position to the bottom, the width decreases below the position and increases again in the vicinity of the bottom. The recess is not separated from the top of the ONO film ON. The gate length direction in this application refers to a direction in which current flows through a channel of a field effect transistor, i.e., a direction in which a source region is connected to a drain region. FIGS. 1 to 17 are each a sectional view along the gate length direction of each of a transistor Q1, a transistor Q2, and a memory cell MC illustrated in FIG. 17.

The sidewall of the control gate electrode CG illustrated in FIG. 7 continuously includes a first sidewall, a second sidewall, and a third sidewall in this order from a top side to a bottom side of the control gate electrode CG. Specifically, the upper end of the first sidewall is in contact with the top of the control gate electrode CG, and the lower end of the first sidewall is in contact with the top of the second sidewall. The lower end of the second sidewall is in contact with the top of the third sidewall, and the lower end of the third sidewall is in contact with the top of the ONO film ON.

The first sidewall corresponds to the sidewall of the control gate electrode CG above the recess. The second and third sidewalls each correspond to the surface of the recess. The second sidewall is a portion of the recess, which corresponds to the sidewall of the control gate electrode CG above a portion having the smallest width in the gate length direction of the control gate electrode CG. The third sidewall is a portion of the surface of the recess, which corresponds to the sidewall of the control gate electrode CG below the second sidewall, and corresponds to the sidewall of the control gate electrode CG below the portion having the smallest width in the gate length direction of the control gate electrode CG.

A first angle defined by the first sidewall and the main surface of the semiconductor substrate SB directly below the control gate electrode CG is 90° or smaller. That is, the first angle is a right angle or an acute angle. A second angle defined by the second sidewall and the main surface of the semiconductor substrate SB directly below the control gate electrode CG is an obtuse angle, or larger than 90°. A third angle defined by the third sidewall and the main surface of the semiconductor substrate SB directly below the control gate electrode CG is an acute angle, or smaller than 90°. An angle defined by the third sidewall and the top of the ONO film ON is smaller than the first angle at a portion where the third sidewall is in contact with the top of the ONO film ON. In this way, the control gate electrode CG having a constriction at the lower side of the sidewall has a skirt part expanding in the gate length direction in the vicinity of the bottom thereof.

To form such a constricted shape, etching is performed for a long time in the soft-landing etching step compared with a case where the entire sidewall of the control gate electrode CG is formed flat at an angle possibly perpendicular to the main surface of the semiconductor substrate SB. Specifically, for example, soft-landing etching is performed for 95 sec. Such excessively long etching allows an etching material to be accumulated in the vicinity of the top of the ONO film ON beside the control gate electrode CG, thereby the lower sidewall of the control gate electrode CG is easily shaved. Consequently, the constricted shape is formed.

Subsequently, as illustrated in FIG. 8, dry etching is further performed, thereby the protective film PF is removed to expose the entire sidewall of the control gate electrode CG. That is, dry etching called overetching is performed. Such etching is performed under a condition of a high selectivity to silicon oxide in order to prevent the upper silicon oxide film OX2 of the ONO film ON from being removed. That is, etching is performed under a high-pressure condition using an $HBr/O_2$ gas-based etching gas, for example.

Although such overetching can remove the polysilicon film configuring the control gate electrode CG, the entire sidewall of the control gate electrode CG is substantially evenly covered with the protective film PF; hence, the sidewall of the control gate electrode CG formed in the step described with FIG. 7 is not locally shaved. In the first embodiment, at least three times of dry etching (main etching, soft-landing etching, and overetching) are performed in this way, thereby the polysilicon film PS2 is patterned to form the control gate electrode CG. In each of the soft-landing etching and the overetching, etching is performed under a condition of a high selectivity to silicon oxide.

Subsequently, as illustrated in FIGS. 9 and 10, dry etching is performed with the photoresist film PR1 as a mask to remove the ONO film ON exposed from the control gate electrode CG and the polysilicon film PS2. Consequently, the main surface of the semiconductor substrate SB in the memory cell region 1A, the top of the element isolating region EI, and the top of the polysilicon film PS1 in each of the low-withstand-voltage transistor region 1B and the high-withstand-voltage transistor region 1C are exposed. FIG. 10 illustrates part of the structure illustrated in FIG. 9 in an enlarged manner, which includes the control gate electrode CG and the ONO film ON in the memory cell region 1A.

As illustrated in FIG. 10, an angle defined by the sidewall of the ONO film ON and the main surface of the semiconductor substrate SB directly below the ONO film ON is 90° or smaller. That is, the angle is a right angle or an acute angle. A corner as a boundary between the top and the sidewall of the ONO film ON is in contact with the skirt part of the sidewall of the control gate electrode CG. That is, the end of the third sidewall is continuously in contact with the end of the sidewall of the ONO film ON. In other words, a distance between the bottom of the control gate electrode CG and the end of the top of the ONO film ON is zero in the gate length direction.

Figure 11:
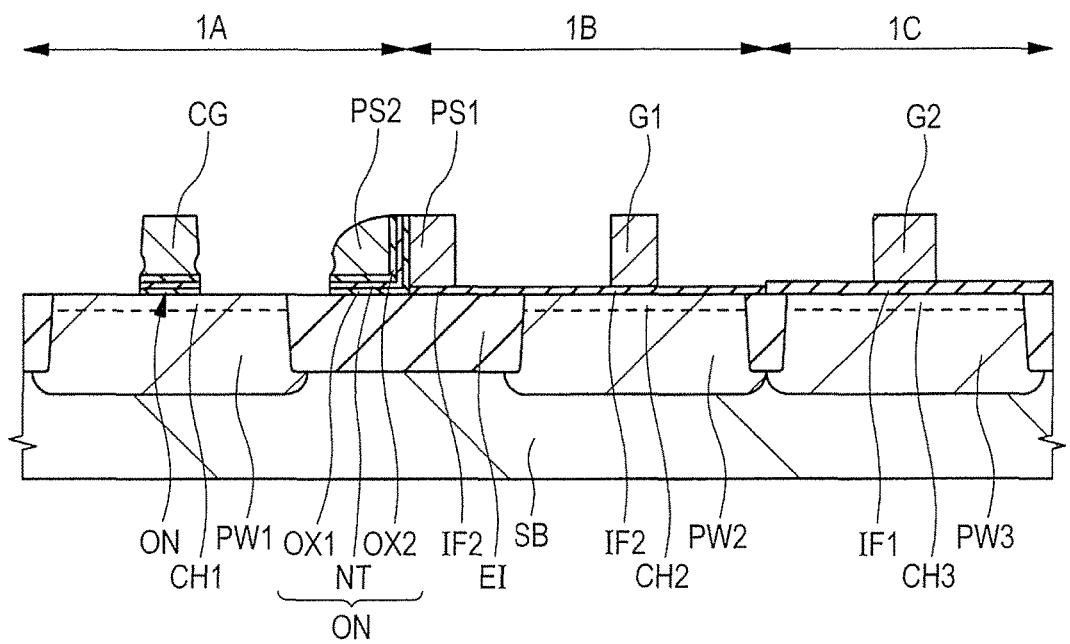
FIG. 11 is a sectional view of the semiconductor device during the manufacturing process following FIG. 10.

Subsequently, as illustrated in FIG. 11, an n impurity (for example, phosphorous (P)) is implanted into the polysilicon film PS1 with a photolithography technique and an ion implantation process. Consequently, the polysilicon film PS1 becomes an n semiconductor film. Subsequently, the polysilicon film PS1 is processed using a photolithography technique and a dry etching process, thereby the top of each of the insulating films IF1 and IF2 is exposed. Through such processing, a gate electrode G1 including the polysilicon film PS1 is formed in the low-withstand-voltage transistor region 1B, and a gate electrode G2 including the polysilicon film PS1 is formed in the high-withstand-voltage transistor region 1C. The gate electrode G2 has a gate length larger than the gate electrode G1.

The insulating film IF2 in the low-withstand-voltage transistor region 1B configures a gate insulating film of a low-withstand-voltage transistor to be formed later, and the insulating film IF1 in the high-withstand-voltage transistor region 1C configures a gate insulating film of a high-withstand-voltage transistor to be formed later.

A pattern of the polysilicon film PS1 is left on the ONO film ON provided on a sidewall of the sidewall-like polysilicon film PS2 formed in the vicinity of a boundary between the memory cell region 1A and the low-withstand-voltage transistor region 1B. Although each of the polysilicon films PS1 and PS2 is a pattern remaining directly above the element isolating region EI while having a structure like a gate electrode, the polysilicon film configures no circuit in a semiconductor device completed later. The sidewall of each of the gate electrodes G1 and G2 is flat, i.e., has no constricted shape unlike the control gate electrode CG.

Figure 12:
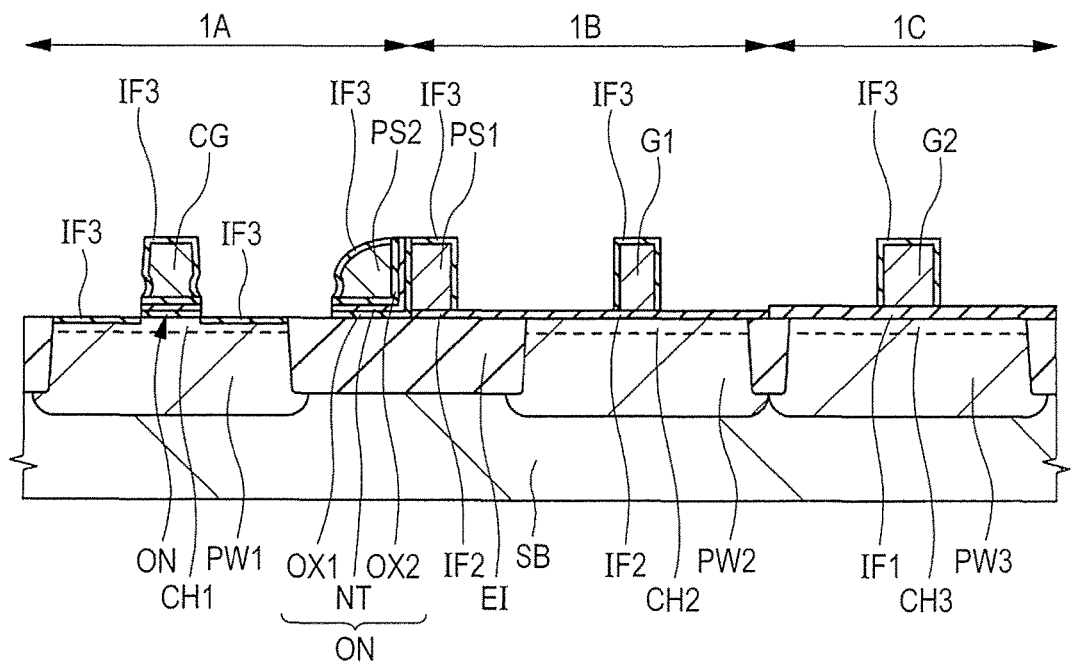
FIG. 12 is a sectional view of the semiconductor device during the manufacturing process following FIG. 11.

Subsequently, as illustrated in FIG. 12, each of exposed surfaces of the control gate electrode CG, the polysilicon films PS1 and PS2, and the gate electrodes G1 and G2 is oxidized by a dry oxidation process. Consequently, an insulating film IF3 is formed, which covers the sidewalls and tops of the control gate electrode CG, the polysilicon films PS1 and PS2, and the gate electrodes G1 and G2. The insulating film IF3 has a thickness of 2 to 3 nm, for example. The insulating film IF3 includes a silicon oxide film, for example. The insulating film IF3 is also formed on the main surface of the semiconductor substrate SB exposed in the memory cell region 1A.

The oxidation process can be roughly classified into a plasma oxidation process and a thermal oxidation process. The thermal oxidation process is classified into a wet oxidation process and the dry oxidation process performed in the above-described oxidation step. The plasma oxidation process (radical oxidation process) includes, for example, an ISSG oxidation process. The ISSG oxidation process is performed using oxygen ($O_2$) radical. In the wet oxidation process, oxidation is performed using an aqueous solution containing water ($H_2O$) or oxygen. The dry oxidation process is performed using oxygen ($O_2$) gas. In the thermal oxidation process, heat must be applied to the semiconductor substrate SB irrespective of the wet oxidation process or the dry oxidation process. Ability to oxidize a target semiconductor material is lowered in order of the plasma oxidation process, the wet oxidation process, and the dry oxidation process. That is, among the above-described oxidation processes, the plasma oxidation process is most effective in oxidation while the dry oxidation process is least effective in oxidation.

Figure 13:
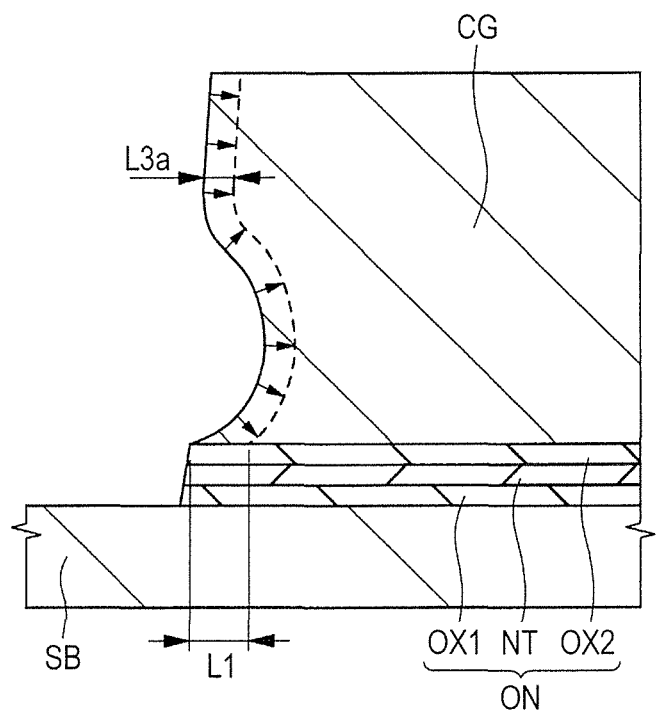
FIG. 13 is a sectional view of the semiconductor device during the manufacturing process following FIG. 11.
Figure 14:
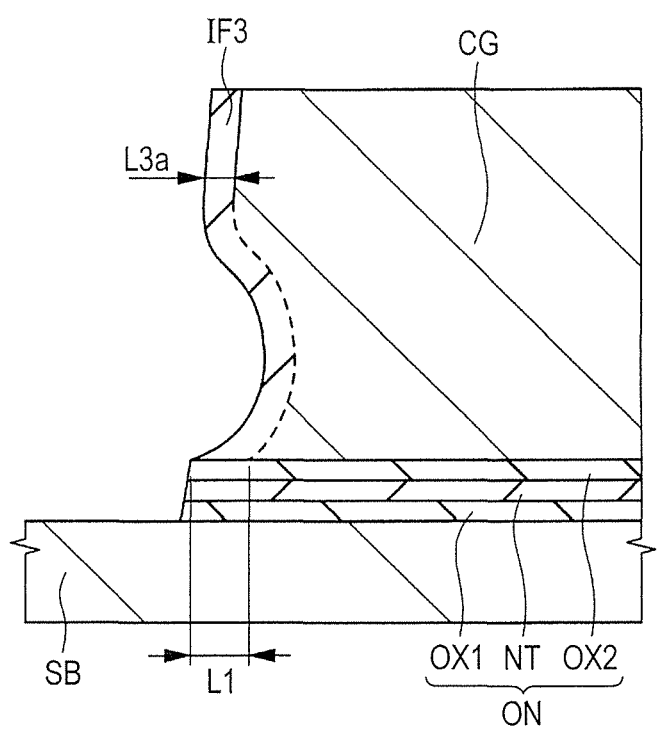
FIG. 14 is a sectional view of the semiconductor device during the manufacturing process following FIG. 13.

The oxidation step performed herein is specifically described with FIGS. 13 and 14. FIGS. 13 and 14 are each a sectional view enlargedly illustrating the vicinity of the constricted portion in a lower side of one sidewall of the control gate electrode CG in the memory cell region 1A. FIG. 13 shows directions, in which the control gate electrode CG is gradually oxidized from a surface side, by arrows. FIG. 13 further shows a boundary between the sidewall of the oxidized control gate electrode CG and the insulating film IF3 (see FIGS. 12 and 14) by a broken line. FIG. 14 omits illustration of the insulating film IF3 formed in contact with the main surface of the semiconductor substrate SB. FIGS. 13 and 14 each omit illustration of the channel region and the well.

The dry oxidation process allows light oxidation. Hence, as illustrated in FIGS. 13 and 14, only the exposed surface of the control gate electrode CG is oxidized while the bottom of the control gate electrode CG is not oxidized at a position away from the sidewall of the control gate electrode CG. In such an oxidation step, the sidewall of the control gate electrode CG is oxidized with a substantially even thickness. Specifically, silicon, which exists within a range of a roughly constant depth in a direction perpendicular to the surface of the sidewall, reacts with oxygen, and is thus formed into the insulating film IF3 including a silicon oxide film. As illustrated in FIG. 14, even after the insulating film IF3 is formed, the constriction (recess) of the sidewall of the control gate electrode CG is in contact with the top of the ONO film ON.

In this oxidation treatment, rapid thermal oxidation (RTO), a type of the dry oxidation process, is performed. Pre-dry treatment (drying step) is performed at 650° C. for 30 sec, and then rapid oxidation treatment is performed at 800° C. while 25 slm of $O_2$ gas is supplied.

At this time, the third sidewall of the control gate electrode CG, i.e., the sidewall of the skirt part has an acute angle with respect to the top of the ONO film ON; hence, the third sidewall is oxidized toward the top of the ONO film ON. Hence, part of the insulating film IF3 formed through oxidation of the third sidewall reaches the top of the ONO film ON. Specifically, since the skirt part including the third sidewall corresponds to a portion having a small thickness of the control gate electrode CG, the skirt part is significantly oxidized in the gate length direction by the dry etching. That is, the third sidewall, which exists on a side upper than the contact between the ONO film ON and the control gate electrode CG, is oxidized, thereby part of the bottom of the control gate electrode CG is oxidized.

Consequently, a length L1 in the gate length direction of the insulating film IF3, which is in contact with the top of the ONO film ON on one sidewall side of the control gate electrode CG, is larger than a distance over which the surface of the control gate electrode CG is oxidized in a direction perpendicular to that surface, i.e., larger than the thickness of the insulating film IF3. The length L1 in the gate length direction of the insulating film IF3 is larger than a length L3a in the gate length direction of the insulating film IF3 formed through oxidation of the first sidewall, for example. This is because inclination of the third sidewall to a vertical direction perpendicular to each of the top of the ONO film ON and the main surface of the semiconductor substrate SB is larger than inclination of the first sidewall to the vertical direction. In other words, the third sidewall extends in a direction acuter than the first sidewall with respect to each of the top of the ONO film ON and the main surface of the semiconductor substrate SB.

The oxidation step allows the sidewall of the control gate electrode CG to be recessed toward the middle of the control gate electrode CG; hence, an end of the control gate electrode CG in contact with the top of the ONO film ON is separated from the end of the top of the ONO film ON by the length L1. Specifically, the end of the ONO film ON more projects than the end of the bottom of the control gate electrode CG to the outside of the control gate electrode CG in the gate length direction.

Figure 15:
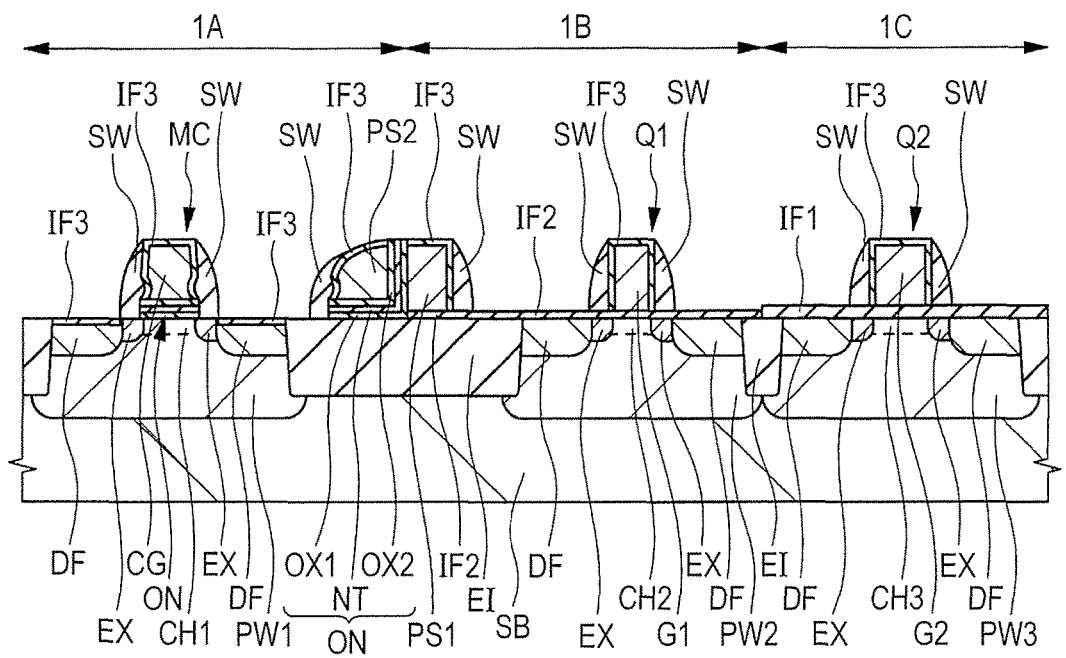
FIG. 15 is a sectional view of the semiconductor device during the manufacturing process following FIG. 14.

Subsequently, as illustrated in FIG. 15, an undepicted offset spacer including a thin insulating film is formed, the insulating film covering each of the sidewalls of the control gate electrode CG, the gate electrode G1, and the gate electrode G2. Subsequently, an n impurity (for example, arsenic (As) or phosphorous (P)) is implanted into the main surface of the semiconductor substrate SB in each of the memory cell region 1A, the low-withstand-voltage transistor region 1B, and the high-withstand-voltage transistor region 1C, thereby extension regions EX as $n^-$ semiconductor regions are formed.

In the memory cell region 1A, a pair of extension regions EX are formed across the control gate electrode in the main surface of the semiconductor substrate SB. In the low-withstand-voltage transistor region 1B, a pair of extension regions EX are formed across the gate electrode G1 in the main surface of the semiconductor substrate SB. In the high-withstand-voltage transistor region 1C, a pair of extension regions EX are formed across the gate electrode G2 in the main surface of the semiconductor substrate SB.

The extension regions EX in the respective regions may be formed by ion implantation under different implantation conditions in different ion implantation steps. Specifically, various extension regions EX having different concentrations or depths may be formed in accordance with properties of elements formed in the respective regions.

Subsequently, a sidewall SW is formed, which covers the sidewall on each side of each of the control gate electrode CG, the gate electrode G1, and the gate electrode G2. A silicon oxide film and a silicon nitride film are formed in this order on the semiconductor substrate SB by, for example, a CVD process, and then the silicon oxide film and the silicon nitride film are each partially removed by anisotropic etching to expose the tops of the semiconductor substrate SB, the insulating film IF1, and the insulating film IF2, thereby the sidewall SW can be formed in a self-aligning manner. In the drawings, part of the insulating film IF3, which is formed in contact with the main surface of the semiconductor substrate SB in the memory cell region 1A and is located directly below the sidewall SW, is assumed as part of the sidewall SW and thus not shown.

Subsequently, a plurality of diffusion layers DF as $n^+$ semiconductor regions (impurity diffusion regions) are formed by an ion implantation process or the like in each of the memory cell region 1A, the low-withstand-voltage transistor region 1B, and the high-withstand-voltage transistor region 1C. Specifically, an n impurity (for example, arsenic (As) or phosphorous (P)) is introduced into the main surface of the semiconductor substrate SB by an ion implantation process with the control gate electrode CG, the gate electrodes G1 and G2, and the sidewall SW as a mask. Consequently, the diffusion layers DF as the $n^+$ semiconductor regions are formed. Each diffusion layer DF has a high impurity concentration and a deep junction depth (depth) compared with the extension region EX. The diffusion layer DF may be formed with a junction depth shallower than the extension region EX.

Consequently, source and drain regions, each having a lightly doped drain (LDD) structure, are formed in each of the memory cell region 1A, the low-withstand-voltage transistor region 1B, and the high-withstand-voltage transistor region 1C, where the source and drain regions each include the extension region EX as an $n^-$ semiconductor region and the diffusion layer DF as the $n^+$ semiconductor region having a higher impurity concentration than the extension region EX. Although the diffusion layers DF in the regions can be formed in one ion implantation step, the diffusion layers DF in the regions may be formed in different ion implantation steps so as to have different impurity concentrations or different depths.

Activation anneal is subsequently performed, which is heat treatment activating an impurity introduced into each semiconductor region (each of the extension region EX and the diffusion layer DF) for the source and drain regions.

The source and drain regions including the extension regions EX and the diffusion layers DF and the control gate electrode CG, which are formed in the memory cell region 1A, configure a field effect transistor. The source and drain regions, the control gate electrode CG, and the charge accumulating part including the silicon nitride film NT configure a memory cell MC. The source and drain regions and the gate electrode G1, which are formed in the low-withstand-voltage transistor region 1B, configure a low-withstand-voltage field effect transistor (transistor Q1). The source and drain regions and the gate electrode G2, which are formed in the high-withstand-voltage transistor region 1C, configure a high-withstand-voltage field effect transistor (transistor Q2). The transistor Q2 operates at a voltage higher than the transistor Q1.

Figure 16:
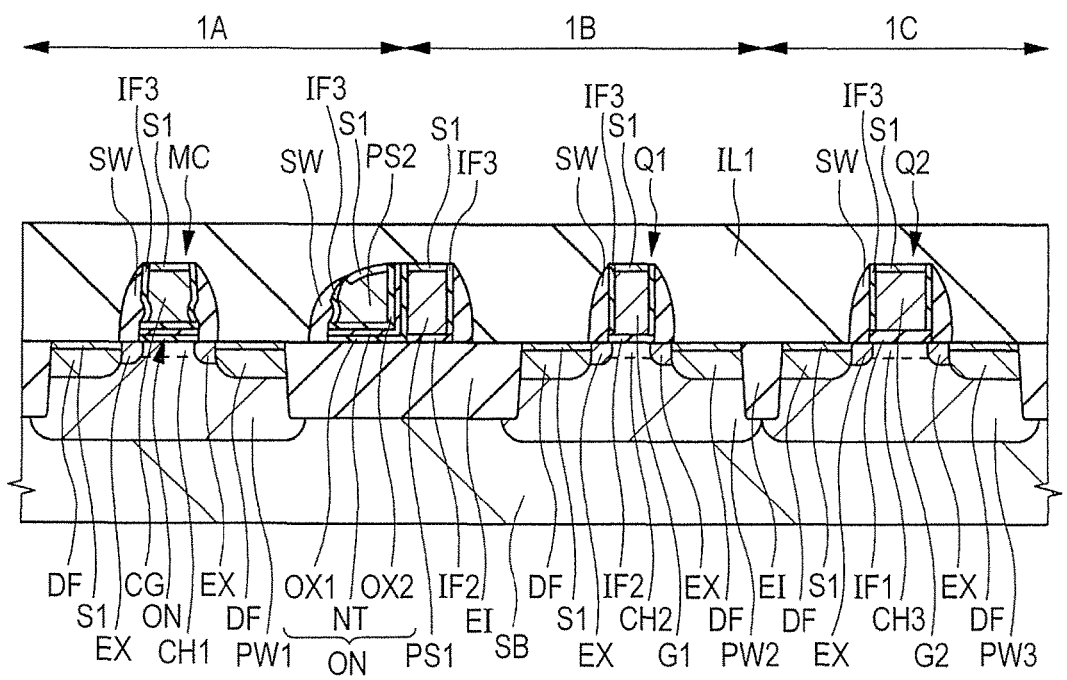
FIG. 16 is a sectional view of the semiconductor device during the manufacturing process following FIG. 15.

Subsequently, as illustrated in FIG. 16, a silicide layer S1 is formed. The silicide layer S1 can be formed through a so-called self-aligned silicide (salicide) process. Specifically, the silicide layer S1 can be formed as follows.

First, an undepicted TEOS film is formed on the main surface of the semiconductor substrate SB by, for example, a CVD process, and then the TEOS film is removed from a region, in which the silicide layer S1 is formed, with a photolithography technique and an etching process. That is, a region, in which the silicide layer S1 is not formed, is still covered with the TEOS film. The insulating film IF3 on each of the tops of the control gate electrode CG and the gate electrodes G1 and G2 is removed in such a removal step of the TEOS film. In addition, the insulating film IF3, which is exposed from the sidewall SW while being in contact with the main surface of the semiconductor substrate SB, is removed in the removal step.

The insulating film IF2 exposed from the gate electrode G1 in the low-withstand-voltage transistor region 1B and the insulating film IF1 exposed from the gate electrode G2 in the high-withstand-voltage transistor region 1C are removed in the removal step. The insulating film IF2 directly below the gate electrode G1 serves as a gate insulating film of the transistor Q1. The insulating film IF1 directly below the gate electrode G2 serves as a gate insulating film of the transistor Q2.

Figure 17:
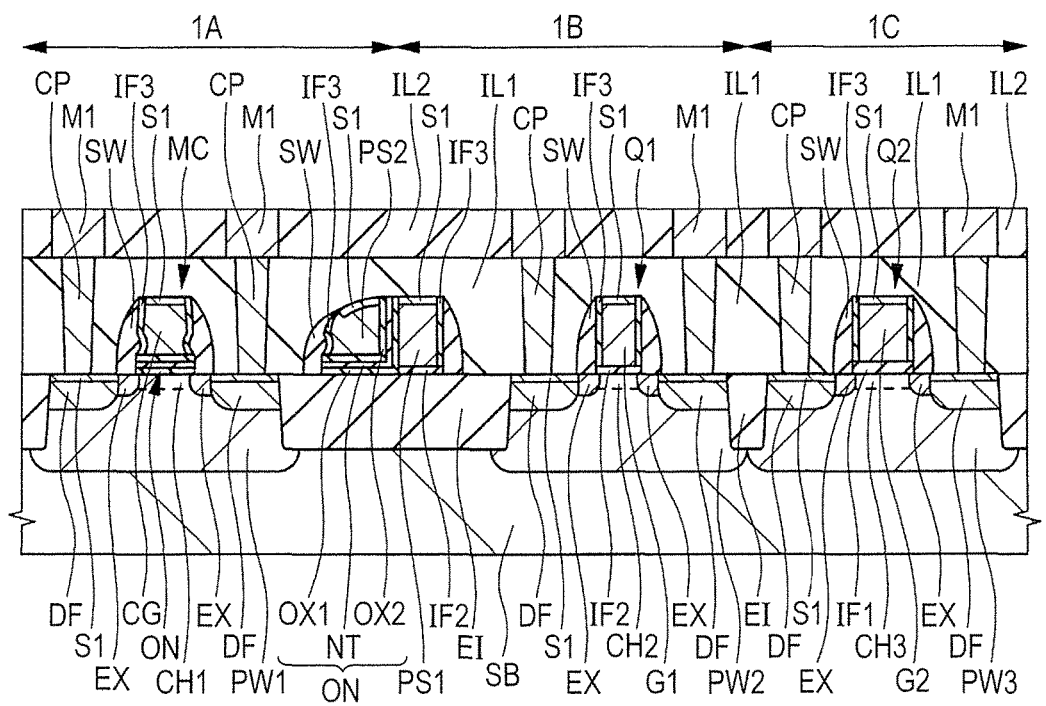
FIG. 17 is a sectional view of the semiconductor device during the manufacturing process following FIG. 16.

Consequently, the tops of the control gate electrode CG, the tops of the gate electrodes G1 and G2, and the tops of the source and drain regions in each of the low-withstand-voltage transistor region 1B and the high-withstand-voltage transistor region 1C are exposed. Subsequently, a metal film for formation of the silicide layer S1 is formed (deposited) over the entire main surface of the semiconductor substrate SB. A simple metal film (pure metal film) or an alloy film can be used as that metal film. For example, the metal film includes a cobalt (Co) film, a nickel (Ni) film, or a nickel-platinum alloy film, and can be formed by a sputtering process or the like. In FIG. 16 and FIG. 17 used in description below, the insulating film IF1 or IF2 directly below the sidewall SW is assumed to be included in the sidewall SW and thus not shown.

Subsequently, the semiconductor substrate SB is subjected to heat treatment (heat treatment for formation of the silicide layer S1), thereby silicon in each of exposed surface portions of the control gate electrode CG, the gate electrodes G1 and G2, and the diffusion layers DF is reacted with the metal film. Consequently, the silicide layer S1 is formed over each of the tops of the control gate electrode CG, the gate electrodes G1 and G2, and the diffusion layers DF. Subsequently, the unreacted metal film is removed by wet etching or the like. The silicide layer S1 may be a cobalt silicide layer, a nickel silicide layer, or a nickel-platinum silicide layer, for example.

Subsequently, an undepicted liner insulating film as an etching stopper film and an interlayer insulating film IL1 are formed in this order over the entire main surface of the semiconductor substrate SB so as to cover the control gate electrode CG, a memory gate electrode MG, the sidewall SW, an upper electrode UE, the gate electrode G1, and a dummy gate electrode DG. The liner insulating film includes, for example, a silicon nitride film, and can be formed by a CVD process, for example. The interlayer insulating film IL1 includes, for example, a simple silicon oxide film, and can be formed by a CVD process, for example. For example, the interlayer insulating film IL1 is formed with a thickness larger than the thickness of the stacked film including the control gate electrode CG and the ONO film ON.

Subsequently, the top of the interlayer insulating film IL1 is polished by a chemical mechanical polishing (CMP) process or the like.

Subsequently, as illustrated in FIG. 17, a plurality of contact plugs CP, an interlayer insulating film IL2, and a plurality of interconnections M1 are formed. First, the interlayer insulating film IL1 and the undepicted liner insulating film are opened using a photolithography technique and a dry etching process. This results in formation of a plurality of contact holes (openings, through-holes) that each penetrate through the interlayer insulating film IL1 and the liner insulating film. The silicide layer S1 on each of the surfaces of the control gate electrode CG, the gate electrodes G1 and G2, and the diffusion layers DF is exposed from the bottom of each contact hole. FIG. 17 illustrates only the contact holes directly above the tops of the diffusion layers DF, and the contact holes directly above the control gate electrode CG and the gate electrodes G1 and G2 are opened in undepicted regions.

Subsequently, a plurality of conductive contact plugs CP mainly including, for example, tungsten (W) are formed as connection conductors in the contact holes. To form the contact plugs CP, for example, a barrier conductor film (for example, a titanium film, a titanium nitride film, or a stacked film thereof) is formed over the interlayer insulating film IL1 including the inside of each contact hole. Subsequently, a main conductor film including a tungsten film is formed over the barrier conductor film so as to completely fill the inside of each contact hole, and then the unnecessary main conductor film and barrier conductor film outside of each contact hole are removed by a CMP process, an etch back process, or the like, thereby the contact plugs CP can be formed.

FIG. 17 shows the barrier conductor film and the main conductor film (tungsten film) configuring the contact plug CP in an integrated manner for simplification of the drawing. The contact plug CP is electrically coupled to each of the control gate electrode CG, the gate electrodes G1 and G2, and the diffusion layers DF via the silicide layer S1.

The sectional view of FIG. 17 does not illustrate the contact plug CP directly above each of the control gate electrode CG and the gate electrodes G1 and G2. Specifically, the contact plug CP is coupled to each of the control gate electrode CG and the gate electrodes G1 and G2 in an undepicted region. The top of each contact plug CP and the top of the interlayer insulating film IL1 are flattened in the same plane.

Subsequently, a first interconnection layer including a first-layer interconnection M1 is formed on the interlayer insulating film IL1 in which the contact plugs CP are embedded. The interconnection M1 can be formed using a so-called single damascene technique. The first interconnection layer includes an interlayer insulating film IL2 and the first-layer interconnection M1 penetrating through the interlayer insulating film IL2. The bottom of the interconnection M1 is coupled to the top of each contact plug CP. In undepicted subsequent steps, a second interconnection layer and a third interconnection layer are formed in this order on the first interconnection layer to form a stacked interconnection layer, and then the semiconductor wafer is divided into individual pieces in a dicing step, and thus a plurality of semiconductor chips are provided.

In this way, the semiconductor device of the first embodiment is manufactured.

The memory cell MC of the first embodiment uses high voltage for write or erase operation, and a power generation circuit for the high voltage requires the high-withstand-voltage transistor Q2 for boosting. A plurality of memory cells MC are formed side by side in an array on the main surface of the semiconductor chip, and the low-withstand-voltage transistor Q1 is used in a circuit that selects a specific memory cell MC, which performs write, erase, or read operation, from the memory cell array. The memory cell MC is a so-called single-gate MONOS memory having one control gate electrode CG on the ONO film ON.

Operation of Nonvolatile Memory

An exemplary operation of a nonvolatile memory is now described. Operation of the memory cell MC as a nonvolatile memory cell includes writing, erasing, and reading. The FN system is used for writing and erasing. In the first embodiment, electron injection into the silicon nitride film as the charge accumulating part in the ONO film is defined as "write", and electron extraction from the silicon nitride film is defined as "erase".

In writing, for example, 0 V is applied to each of the semiconductor substrate SB and the source and drain regions illustrated in FIG. 17, and a high voltage, about 13.5 V, is applied to the control gate electrode CG. Consequently, an electron is injected from the semiconductor substrate SB into the silicon nitride film NT of the ONO film ON through tunneling, and thus writing is performed. At this time, the electron is injected from the main surface of the semiconductor substrate SB into the ONO film ON through tunneling the silicon oxide film (bottom oxide film) OX1 by FN tunneling (FN tunnel effect), and is captured by a trap level in the silicon nitride film NT of the ONO film ON. This results in an increase in threshold voltage of the transistor configuring the memory cell MC. That is, the memory cell MC is written.

In erase of the FN system, contrary to the writing, a high voltage is applied to each of the semiconductor substrate SB and the source and drain regions, and a voltage of 0 V is applied to the control gate electrode CG. Consequently, an electron is injected from the silicon nitride film NT of the ONO film ON into the semiconductor substrate SB through tunneling, and thus erasing is performed. This results in a decrease in threshold voltage of the transistor configuring the memory cell MC. That is, the memory cell MC is erased.

In reading, a voltage Vmg applied to the control gate electrode CG is set to a value between a threshold voltage of the transistor being written and a threshold voltage of the transistor being erased, which makes it possible to determine the written state or the erased state. For example, 0 V is applied to each of the semiconductor substrate SB and the source region, and, for example, 1.5 V is applied to each of the drain region and the control gate electrode CG. Since the threshold voltage is high in the written state in which charge is accumulated in the silicon nitride film NT, the transistor is not turned on. On the other hand, since the threshold voltage is low in the erased state in which charge is extracted from the silicon nitride film NT, the transistor is turned on. In this way, information can be read from the memory cell MC based on the operation type of the transistor.

Effects of First Embodiment

Figure 44:
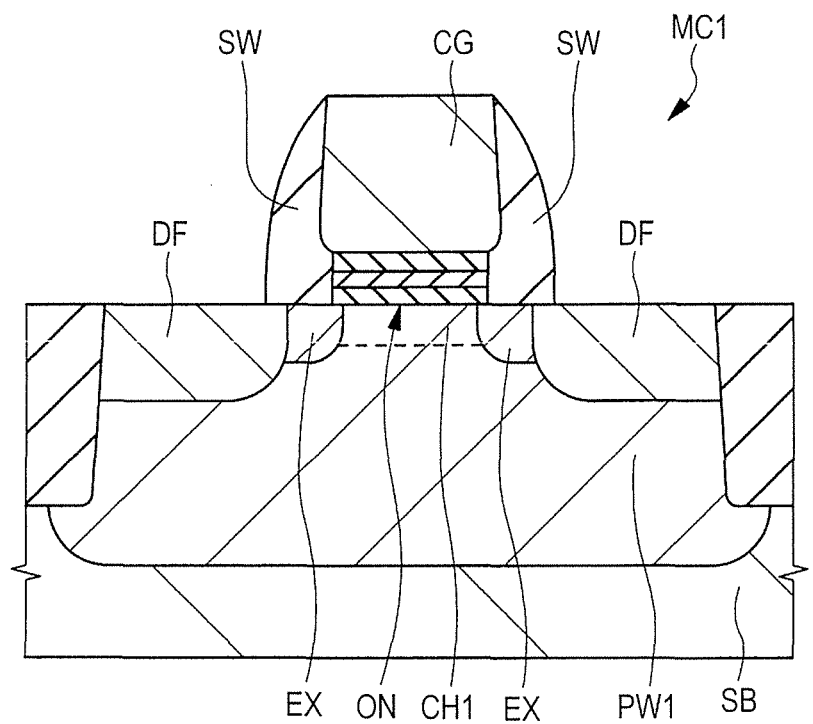
FIG. 44 is a sectional view of a semiconductor device of a first comparative example.
Figure 45:
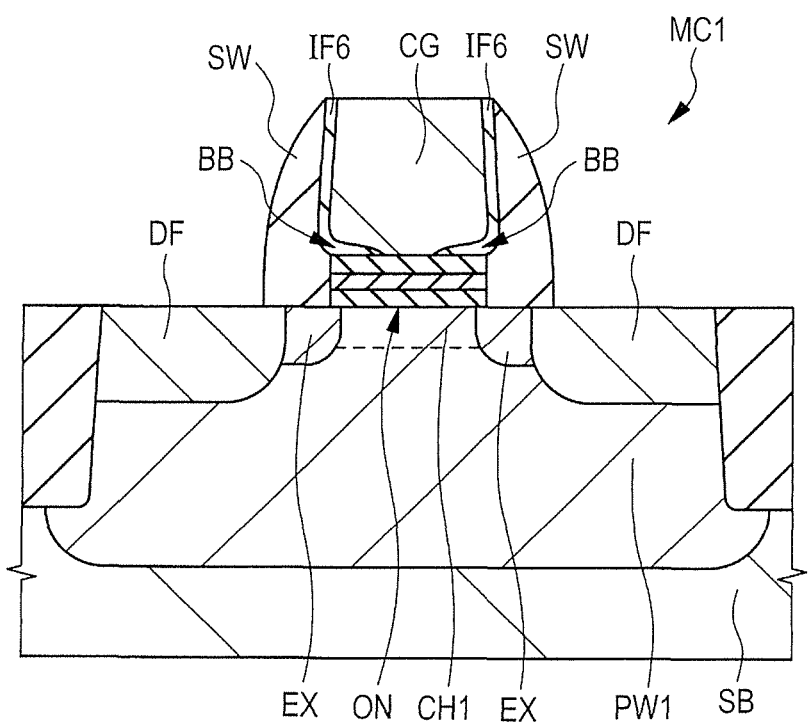
FIG. 45 is a sectional view of a semiconductor device of a second comparative example.

The first embodiment relates to a semiconductor device having a single-gate MONOS memory. Difficulties of semiconductor devices of comparative examples are now described with FIGS. 44 to 50 to describe effects of the first embodiment. FIG. 44 is a sectional view of a semiconductor device of a first comparative example, FIG. 45 is a sectional view of a semiconductor device of a second comparative example, and FIGS. 46 to 50 are each a sectional view of a semiconductor device of a third comparative example during a manufacturing process of the semiconductor device. FIGS. 44 and 45 each illustrate a memory cell of a single-gate MONOS memory in the memory cell region. FIGS. 46 to 50 each enlargedly illustrate a section of a control gate electrode of the single-gate MONOS memory during a manufacturing process of the control gate electrode.

The single-gate MONOS memory is a nonvolatile memory to which a high voltage is applied for rewriting (writing and erasing) of a memory cell, and a large potential difference is produced for rewriting between a semiconductor substrate and a control gate electrode formed on the main surface of the semiconductor substrate with an ONO film in between. Hence, high withstand voltage characteristics are required between the semiconductor substrate and the control gate electrode.

FIG. 44 illustrates a memory cell MC1 of the first comparative example. The memory cell MC1 is a single-gate MONOS memory having a control gate electrode CG on the main surface of the semiconductor substrate SB including source and drain regions with an ONO film ON in between. In the first comparative example, an end of the control gate electrode CG more projects to the outside than an end of the ONO film ON in a gate length direction of the control gate electrode CG. This means that there is a region having no ONO film ON between the end of the control gate electrode CG and the semiconductor substrate SB directly below the end of the control gate electrode CG.

In such a case, dielectric breakdown easily occurs between the semiconductor substrate SB and the control gate electrode CG due to rewriting stress of the memory cell MC1. This reduces reliability of the semiconductor device. Such a difficulty is more conspicuous in the case where the semiconductor device is reduced in size, and, for example, the ONO film ON is reduced in thickness.

On the other hand, as shown in FIG. 45 illustrating a second comparative example, it is considered that part of a surface of the control gate electrode CG of a memory cell MC2 is oxidized to prevent occurrence of the dielectric breakdown. Specifically, the control gate electrode CG is formed on the semiconductor substrate SB with the ONO film ON in between, and then the surface of the control gate electrode CG is oxidized by a wet oxidation process. This results in formation of an insulating film IF6 covering the top, the sidewall, and part of the bottom of the control gate electrode CG. This oxidation treatment leads to formation of a bird's beak part BB as part of the insulating film IF6, which covers the bottom of the end of the control gate electrode CG in the gate length direction.

The bird's beak part BB is a silicon oxide film, the thickness of which decreases from a sidewall to the middle of the control gate electrode CG, and has a wedge-like shape in a section along the gate length direction. Through formation of the bird's beak part BB, each corner of the bottom of the control gate electrode CG is rounded and separated from the main surface of the semiconductor substrate SB. This makes it possible to prevent occurrence of the dielectric breakdown. The reason for formation of such a bird's beak part BB is because the wet oxidation process has a relatively high oxidation ability.

Such an oxidation step is probably performed along with an oxidation step as a formation step of a gate insulating film for a high-withstand-voltage transistor formed on the semiconductor substrate SB together with the memory cell MC2. Specifically, when the gate insulating film for the high-withstand-voltage transistor is formed on the main surface of the semiconductor substrate SB after forming a stacked pattern including the control gate electrode CG and the ONO film ON, the surface of the control gate electrode CG is oxidized to form the insulating film IF6 by wet oxidation treatment for formation of that gate insulating film.

The bird's beak part BB is thus formed on either side of the bottom of the control gate electrode CG by the wet oxidation process. This however increases a distance between part of the bottom of the control gate electrode CG and the main surface of the semiconductor substrate SB. In other words, this increases thickness of part of the gate insulating film under the control gate electrode CG. This means a decrease in effective gate length of the control gate electrode CG. In other words, an inversion layer is less likely to be formed in the channel region when a voltage is applied to the control gate electrode CG, leading to difficult operation of the memory cell MC2. This deteriorates operating performance of the transistor configuring the memory cell MC2. A larger voltage is therefore necessary to be applied to the control gate electrode CG for operation of the memory cell MC2. Hence, power saving becomes difficult, and further increase in withstand voltage is required for an element.

It is therefore undesirable to perform oxidation treatment on the control gate electrode CG by an oxidation process with a large oxidation amount as described with FIG. 45. Such a difficulty is more conspicuous with a further reduction in size of the semiconductor device. This is because when a pattern of each gate electrode is reduced with a size reduction of the semiconductor device, width of the bird's beak part BB formed by the wet oxidation process occupies a larger percentage of the gate length, leading to significant deterioration in operating performance of the memory cell MC2.

Although a plasma oxidation process is probably used rather than the wet oxidation process as a process for oxidizing the surface of the control gate electrode CG, since the plasma oxidation process has an oxidation ability higher than the wet oxidation process, the radical oxidation also oxidizes an end of the silicon nitride film NT configuring the ONO film ON. Specifically, the end of the silicon nitride film NT having an insulating ability higher than the silicon oxide film is more recessed than the sidewall of the control gate electrode CG in the gate length direction, leading to a shape similar to the structure illustrated in FIG. 44. Hence, it is inappropriate that the plasma oxidation process is used to oxidize the sidewall of the control gate electrode CG because oxidization of the end of the silicon nitride film NT deteriorates insulating ability of the control gate electrode CG.

On the other hand, in the first embodiment, the insulating film IF1 to be the gate insulating film for the high-withstand-voltage transistor is formed as illustrated in FIG. 2, and then the control gate electrode CG is formed as illustrated in FIG. 5. This prevents the surface of the control gate electrode CG from being oxidized by oxidation treatment during formation of the insulating film IF1, making it possible to prevent variations in properties (such as deterioration in operating performance) of the memory cell MC (see FIG. 17) due to formation of the bird's beak part BB.

When wet oxidation treatment is performed after the step described with FIG. 5 while the control gate electrode CG is exposed, a difficulty similar to that of the comparative example described with FIG. 45 also occurs. In the first embodiment, therefore, the wet oxidation treatment is not performed after formation of the control gate electrode CG at least until the interlayer insulating film IL1 (see FIG. 16) covers the control gate electrode CG. When the control gate electrode CG is formed by dry etching, the sidewall of the control gate electrode CG may be damaged. The surface of the control gate electrode CG is oxidized in the step described with FIG. 12 to avoid such damage. Such an oxidation step uses a dry oxidation process having an oxidation ability lower than the wet oxidation process. The dry oxidation process prevents formation of the bird's beak part BB. It is therefore possible to prevent variations in properties of the memory cell MC due to formation of the bird's beak part BB.

The wet oxidation process produces a large quantity of heat during oxidation treatment compared with the dry oxidation process and the like. Hence, if wet oxidation treatment is performed for oxidation of the surface of the control gate electrode CG in the step described with FIG. 12, an impurity contained in the formed well or channel region is greatly diffused during the wet oxidation treatment, leading to variations in properties of the transistor formed later.

On the other hand, the first embodiment uses the dry oxidation process, in which heat load is smaller than in the wet oxidation process, in the oxidation treatment described with FIG. 12. It is therefore possible to prevent the impurity from being diffused from each of the formed wells PW1 to PW3, channel regions CH1 to CH3, control gate electrode CG, and polysilicon film PS1 to be the gate electrode later during the oxidation treatment. That is, variations in properties of the transistors formed later can be prevented. Consequently, reliability of the semiconductor device can be improved.

The inventors have investigated that width of the ONO film ON in the gate length direction is made larger than width of the control gate electrode CG, which is assumed as a method of preventing dielectric breakdown described with FIG. 44. A method of manufacturing a semiconductor device of a third comparative example investigated by the inventors is now described with FIGS. 46 to 50. In a manufacturing process of the third comparative example, oxidation treatment is performed by a dry oxidation process on a control gate electrode having a flat sidewall formed roughly perpendicularly to the main surface of a substrate, thereby the sidewall of the control gate electrode is recessed.

Specifically, in the manufacturing process of the semiconductor device of the third comparative example, first, steps similar to those described with FIGS. 1 to 4 are performed, and then the polysilicon film PS2 (see FIG. 4) is processed to form the control gate electrode. In such a processing step, first, main etching is performed as with the step described with FIG. 6. Specifically, dry etching is performed with the photoresist film PR1 as a mask, thereby the polysilicon film PS1 is dug to its intermediate depth.

Figure 46:
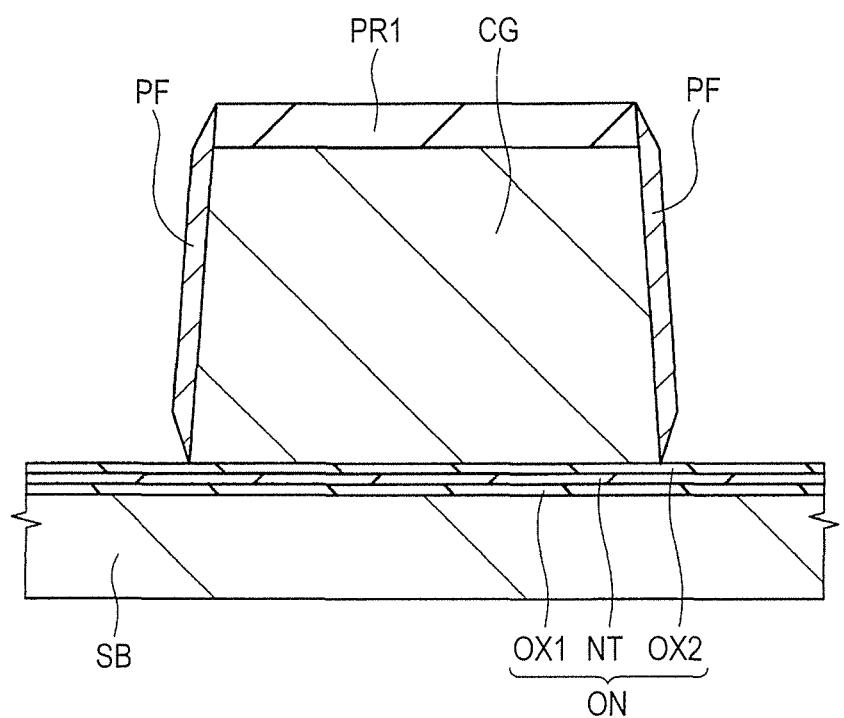
FIG. 46 is a sectional view of a semiconductor device of a third comparative example during a manufacturing process of the semiconductor device.

Subsequently, as illustrated in FIG. 46, soft-landing etching is performed for 65 sec, for example. Consequently, the control gate electrode CG including the polysilicon film PS2 is formed. The required number of seconds for the soft-landing etching performed herein is proper etching time for an etching condition to form the control gate electrode CG having a flat sidewall. The control gate electrode CG is therefore formed while having a flat sidewall without irregularity such as a constriction.

Figure 47:
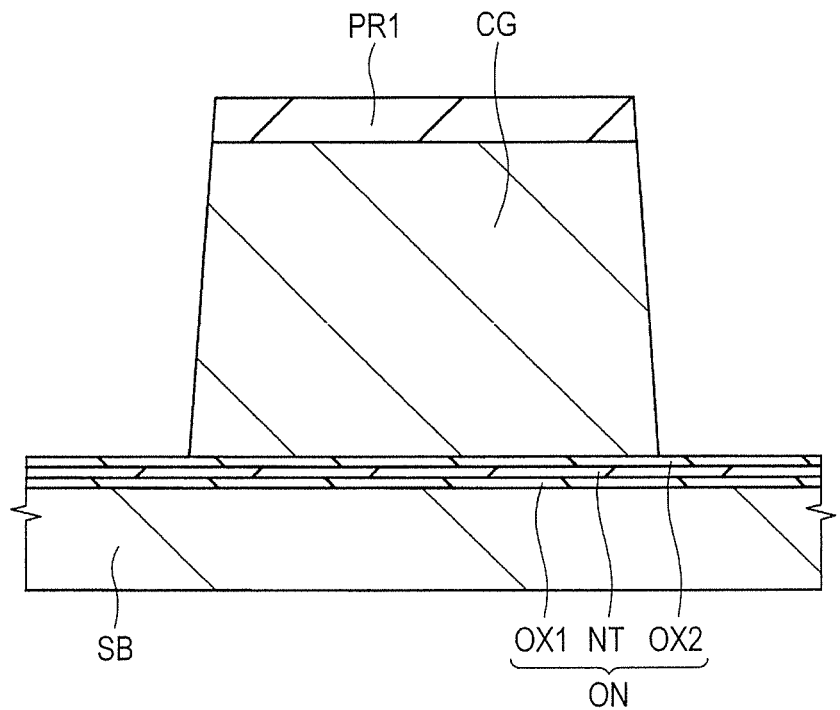
FIG. 47 is a sectional view of the semiconductor device during the manufacturing process following FIG. 46.

Subsequently, as illustrated in FIG. 47, as with the dry etching step described with FIG. 8, overetching is performed to remove the protective film PF adhering to the sidewalls of the control gate electrode CG and the photoresist film PR1.

Figure 48:
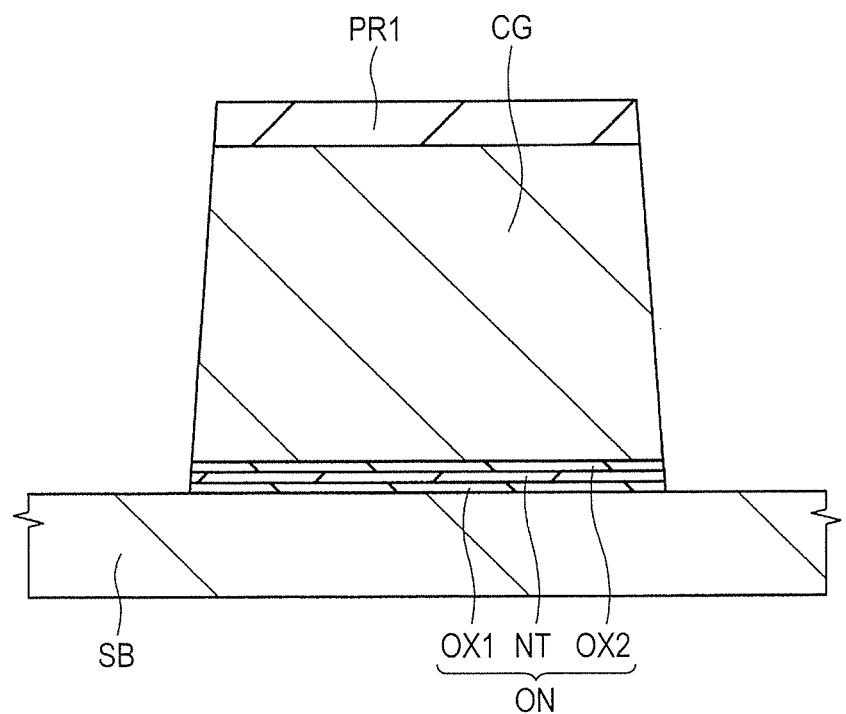
FIG. 48 is a sectional view of the semiconductor device during the manufacturing process following FIG. 47.

Subsequently, as illustrated in FIG. 48, the ONO film ON is processed in the same way as the dry etching step described with FIGS. 9 and 10. The sidewall of the ONO film ON and the sidewall of the control gate electrode CG are located in substantially the same plane. Specifically, the sidewall of the ONO film ON and the sidewall of the control gate electrode CG have roughly the same slope, and an end of the top of the ONO film ON and an end of the bottom of the control gate electrode CG are in contact with each other at substantially the same position in the gate length direction.

Figure 49:
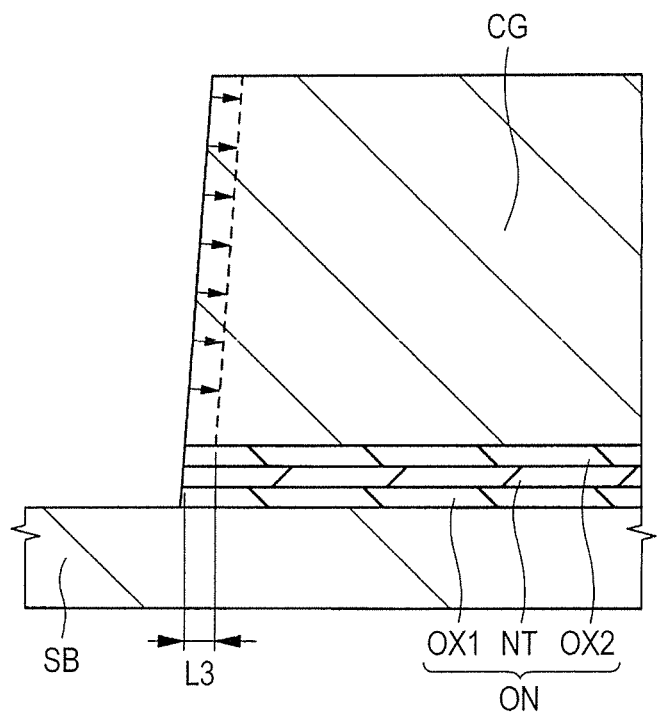
FIG. 49 is a sectional view of the semiconductor device during the manufacturing process following FIG. 48.
Figure 50:
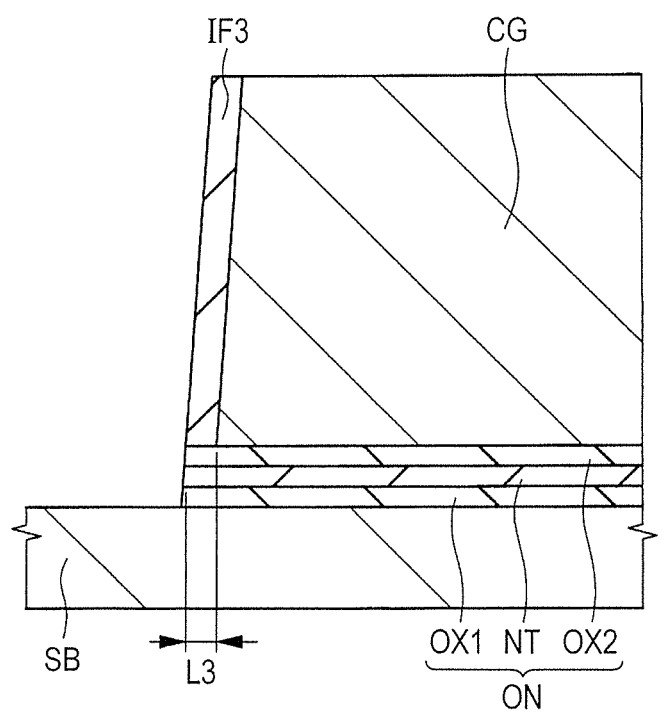
FIG. 50 is a sectional view of the semiconductor device during the manufacturing process following FIG. 49.

Subsequently, a step similar to the step described with FIG. 11 is performed. Subsequently, as illustrated in FIGS. 49 and 50, the surface of the control gate electrode CG is oxidized by a dry oxidation process as in the step described with FIGS. 12 to 14, and thus the insulating film IF3 is formed. As with FIG. 13, FIG. 49 shows by a broken line a region where silicon is oxidized on the sidewall of the control gate electrode CG. FIG. 50 illustrates the insulating film IF3 formed by such oxidation treatment. A span over which silicon is oxidized in a direction perpendicular to the surface of the control gate electrode CG, i.e., thickness of the insulating film IF3 in the direction perpendicular to the surface of the control gate electrode CG is the same as that in the first embodiment as described with FIGS. 12 to 14.

The insulating film IF3 in contact with one sidewall of the control gate electrode CG has a thickness that is roughly the same in the gate length direction at any height. The insulating film IF3 is in contact with the top of the ONO film ON in the gate length direction over a length L3.

Consequently, the sidewall of the control gate electrode CG is recessed; hence, the width of the ONO film ON becomes longer than the width of the control gate electrode CG in the gate length direction. Specifically, the end of the ONO film ON projects to the outside of the control gate electrode CG in the gate length direction compared with the end of the control gate electrode CG. It is therefore likely to be possible to prevent the dielectric breakdown described in the first comparative example. However, the inventors have found that the manufacturing method of the semiconductor device of the third comparative example is not enough to prevent the dielectric breakdown between the control gate electrode CG and the semiconductor substrate SB. Specifically, that sidewall must be more greatly recessed in the gate length direction in order to recess the sidewall of the control gate electrode CG by the dry oxidation process to prevent the dielectric breakdown.

It is likely that an increase in amount of oxidation (oxidation treatment time) by the dry oxidation process increases a distance over which the sidewall of the control gate electrode CG is recessed, allowing the dielectric breakdown to be prevented. However, increasing the oxidation amount increases heat load to the semiconductor substrate SB. That is, such an increase in oxidation amount leads to the same difficulty as the difficulty due to heat load described with the second comparative example as illustrated in FIG. 45. Hence, even if the insulating film IF3 is formed using the dry oxidation process, thickness of the insulating film IF3, i.e., oxidation amount is limitedly increased.

On the other hand, in the first embodiment, the constricted shape is formed in the sidewall of the control gate electrode CG in the step of processing the control gate electrode CG as described with FIGS. 5 to 8, and then the dry oxidation treatment is performed in the oxidation treatment described with FIGS. 12 to 14, thereby the insulating film IF3 is formed on the sidewall of the control gate electrode CG. The first embodiment is the same as the third comparative example in that the oxidation treatment is performed by the dry oxidation process and in the condition of the oxidation treatment, but is different from the third comparative example in shape of the control gate electrode CG before or after the oxidation treatment.

Specifically, as illustrated in FIG. 13, the control gate electrode CG of the first embodiment has the constriction (recess) on the lower side of its sidewall. The third sidewall, which configures the surface of the recess and is in contact with the top of the ONO film ON, is inclined in an acute direction with respect to the top of the ONO film ON, and the skirt part as part of the control gate electrode CG is provided between the third sidewall and the bottom of the control gate electrode CG directly below the third sidewall. When the surface (third sidewall) of the skirt part is subjected to dry oxidation treatment, the polysilicon film having the third sidewall, which is acute with respect to the top of the ONO film ON, is oxidized. As illustrated in FIG. 14, therefore, the length L1, over which the insulating film IF3 is in contact with the top of the ONO film ON in the gate length direction, is larger than the length L3 over which the insulating film IF3 is in contact with the top of the ONO film ON in the gate length direction in the third comparative example (see FIG. 50).

This is because the third sidewall of the control gate electrode CG of the first embodiment is more inclined to the main surface of the semiconductor substrate SB than the sidewall of the control gate electrode CG of the third comparative example. The inclination angle of the first sidewall of the control gate electrode CG of the first embodiment is roughly the same as the inclination angle of the sidewall as a whole of the control gate electrode CG of the third comparative example. The inclination angle in this application refers to a smallest angle between a direction perpendicular to the main surface of the semiconductor substrate SB or the top of the ONO film ON and a target surface. As the inclination angle increases and approaches 90°, the target surface approaches parallel to the main surface of the semiconductor substrate SB.

The length L1 illustrated in FIG. 14, over which the insulating film IF3 and the ONO film ON are in contact with each other, is large in the first embodiment, which means that the end of the control gate electrode CG is recessed by a large length from the end of the ONO film ON in the dry oxidation step described with FIGS. 12 to 13. Specifically, the sidewall of the control gate electrode CG is eroded by the insulating film IF3, and is recessed by the length L1 in the gate length direction. The length L1 is larger than the length L3 (see FIG. 50) in the third comparative example. In the first embodiment, therefore, although dry oxidation is performed under a temperature condition and a time condition similar to those in the third comparative example after formation of the control gate electrode CG, the sidewall of the control gate electrode CG can be more recessed than in the third comparative example.

Specifically, in the first embodiment, oxidation treatment is performed after forming the constricted shape in the lower side of the sidewall of the control gate electrode CG, which provides a shape in which the end of the ONO film ON projects more outward in the gate length direction than the end of the bottom of the control gate electrode CG. It is therefore possible to increase the withstand voltage characteristics between the control gate electrode CG of the memory cell MC (see FIG. 17) and the main surface of the semiconductor substrate SB, and prevent occurrence of dielectric breakdown. Consequently, reliability of the semiconductor device can be improved.

The first embodiment provides the effect of increasing the withstand voltage by recessing the sidewall of the control gate electrode CG after formation of the control gate electrode CG without high-temperature or long dry oxidation and without the wet oxidation process or plasma oxidation process with a large oxidation amount. Consequently, the impurity can be prevented from being excessively diffused from each of the formed silicon film and the formed well or channel region. It is therefore possible to prevent properties of the memory cell MC, the transistor Q1, or the transistor Q2 as illustrated in FIG. 17 from being varied. Hence, reliability of the semiconductor device can be improved.

First Modification

A method of manufacturing a semiconductor device of a first modification of the first embodiment is now described with FIGS. 18 to 25. FIGS. 18 to 25 are each a sectional view of a semiconductor device of the first modification during a manufacturing process of the semiconductor device, each of which illustrates the memory cell region 1A, the low-withstand-voltage transistor region 1B, and the high-withstand-voltage transistor region 1C as in FIG. 1.

In the steps described with FIGS. 1 to 17, the wells of the low-withstand-voltage transistor and the high-withstand-voltage transistor and the polysilicon film for the gate electrode are first formed, and then the ONO film is formed. In the first modification, however, the ONO film is first formed, and then the wells and the channel regions of the low-withstand-voltage transistor and the high-withstand-voltage transistor and the polysilicon film for the gate electrode are formed. The method of processing the control gate electrode, the shape of the control gate electrode, and the subsequent dry oxidation treatment, which each characterize the first embodiment, are the same as the steps described with FIGS. 1 to 17.

Figure 18:
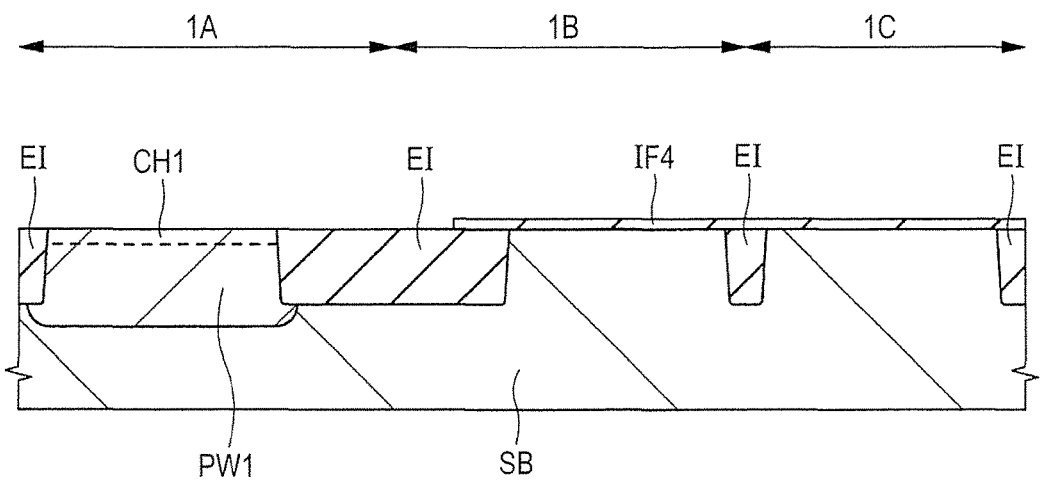
FIG. 18 is a sectional view of a semiconductor device of a first modification of the first embodiment during a manufacturing process of the semiconductor device.

In the manufacturing process of the first modification, first, as illustrated in FIG. 18, the semiconductor substrate SB is provided, and then a plurality of element isolating regions EI are formed in trenches formed in the main surface of the semiconductor substrate SB. Subsequently, an insulating film IF4 covering the main surface of the semiconductor substrate SB is formed by a CVD process, for example. The insulating film IF4 includes a silicon oxide film, for example. Subsequently, the insulating film IF4 is removed from the memory cell region 1A by etching with an undepicted photoresist film as a mask, thereby the main surface of the semiconductor substrate SB in the memory cell region 1A is exposed from the insulating film IF4.

Subsequently, the well PW1 and the channel region CH1 similar to those in FIG. 3 are formed in the main surface of the semiconductor substrate SB in the memory cell region 1A. Subsequently, the photoresist film is removed.

Figure 19:
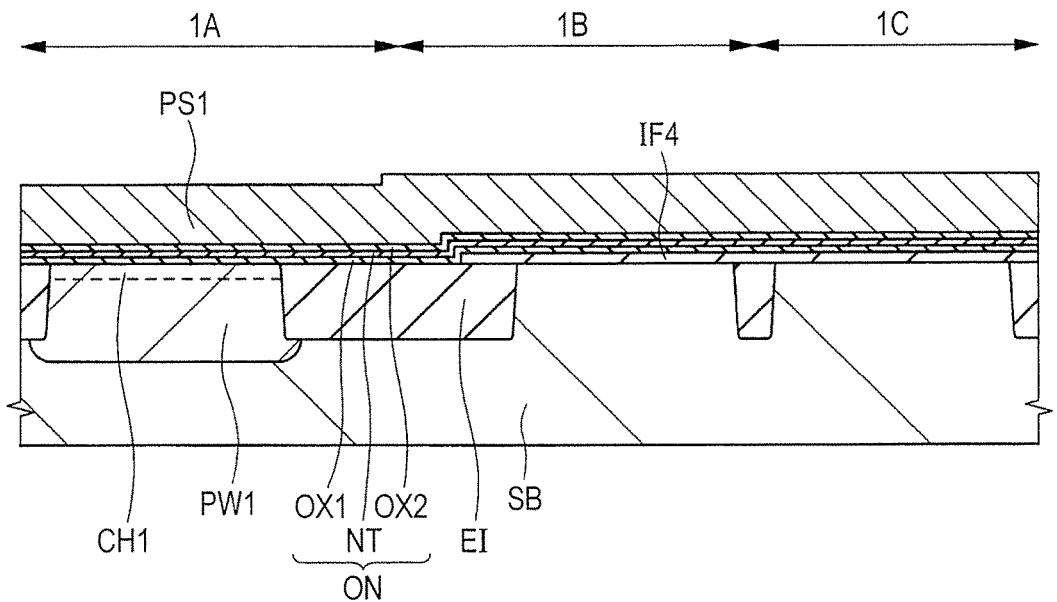
FIG. 19 is a sectional view of the semiconductor device during the manufacturing process following FIG. 18.

Subsequently, as illustrated in FIG. 19, the ONO film ON and the polysilicon film PS1 are formed in this order by, for example, a CVD process over the semiconductor substrate SB and the insulating film IF4. Subsequently, for example, an n impurity ion is implanted into the polysilicon film PS1 by an ion implantation process.

Figure 20:
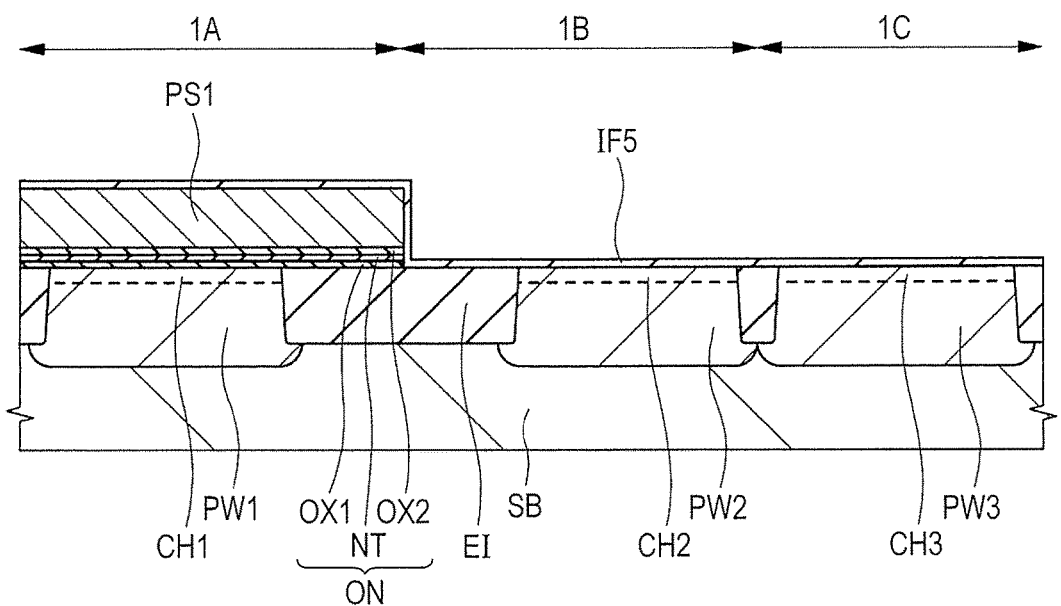
FIG. 20 is a sectional view of the semiconductor device during the manufacturing process following FIG. 19.

Subsequently, as illustrated in FIG. 20, the polysilicon film PS1 and the ONO film ON are removed from the low-withstand-voltage transistor region 1B and the high-withstand-voltage transistor region 1C with a photolithography technique and a dry etching process, thereby the main surface of the semiconductor substrate SB is exposed in each of the low-withstand-voltage transistor region 1B and the high-withstand-voltage transistor region 1C. Subsequently, an insulating film IF5 covering the main surface of the semiconductor substrate SB, the ONO film ON, and the polysilicon film PS1 is formed by a CVD process, for example. The insulating film IF5 includes a silicon oxide film, for example. Subsequently, the p well PW2 and the channel region CH2 are formed in the low-withstand-voltage transistor region 1B, and the p well PW3 and the channel region CH3 are formed in the high-withstand-voltage transistor region 1C, using a photolithography technique and an ion implantation process.

Figure 21:
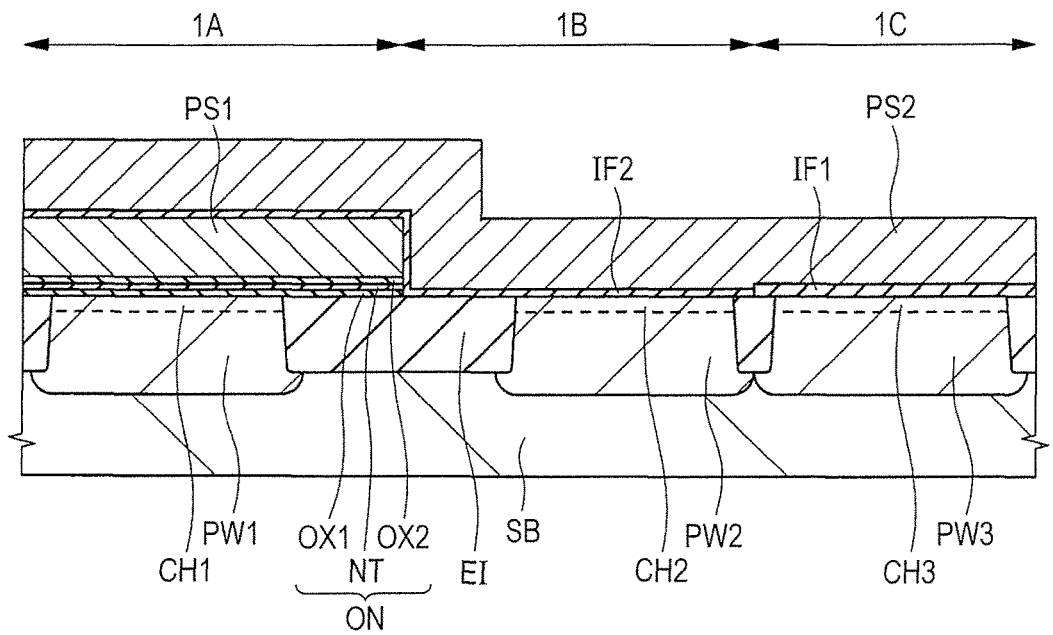
FIG. 21 is a sectional view of the semiconductor device during the manufacturing process following FIG. 20.

Subsequently, as illustrated in FIG. 21, the insulating film IF5 is removed by etching or the like, and then the insulating film IF1, which covers the main surface of the semiconductor substrate SB, the sidewall of the ONO film ON, and the sidewall and the top of the polysilicon film PS1, is formed by a CVD process, for example. Subsequently, the insulating film IF1 is patterned to remove the insulating film IF1 from any region other than the high-withstand-voltage transistor region 1C. Subsequently, the insulating film IF2 is formed so as to cover the exposed main surface of the semiconductor substrate SB in the low-withstand-voltage transistor region 1B. The insulating film IF2 is formed by a thermal oxidation process, for example. In such a case, the insulating film IF2 is probably not formed on the sidewall of the ONO film ON. FIG. 21 however illustrates a structure where the insulating film IF2 covers the sidewall of the ONO film ON for ease in understanding of the drawing.

Subsequently, the polysilicon film PS2 is formed by, for example, a CVD process on the main surface of the semiconductor substrate SB, and then an n impurity is implanted into the polysilicon film PS2. Specifically, a polysilicon film PS2 containing no impurity is formed, and then the impurity is implanted into the polysilicon film PS2. The polysilicon film PS2 may be formed as a silicon film that originally contains the n impurity.

Figure 22:
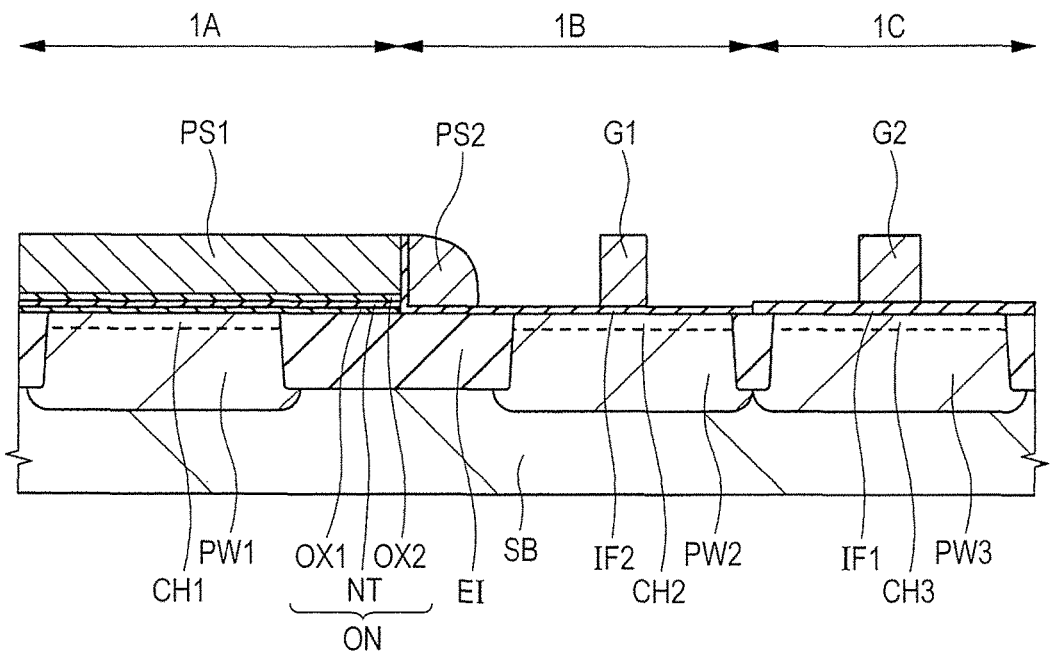
FIG. 22 is a sectional view of the semiconductor device during the manufacturing process following FIG. 21.

Subsequently, as illustrated in FIG. 22, the polysilicon film PS2 is etched back using a photolithography technique and a dry etching process, thereby each of the tops of the insulating films IF1 and IF2 is exposed. Consequently, the gate electrode G1 including the polysilicon film PS2 is formed in the low-withstand-voltage transistor region 1B, and the gate electrode G2 including the polysilicon film PS2 is formed in the high-withstand-voltage transistor region 1C. A sidewall-like polysilicon film PS2 remains on the sidewall of the polysilicon film PS1 with the insulating film IF2 in between.

Figure 23:
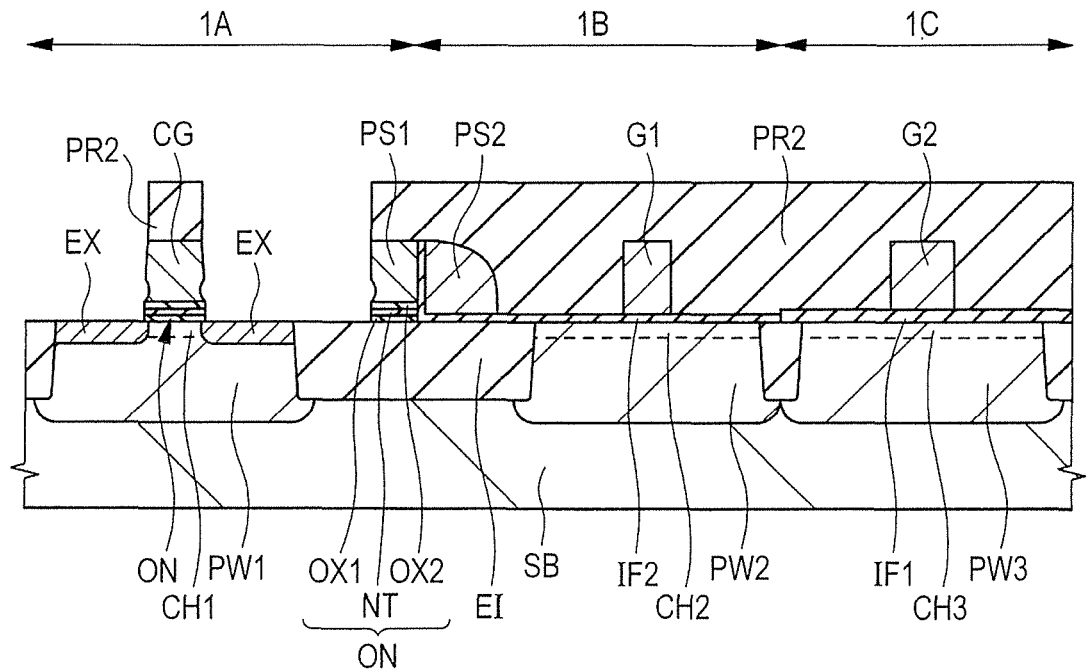
FIG. 23 is a sectional view of the semiconductor device during the manufacturing process following FIG. 22.

Subsequently, as illustrated in FIG. 23, a photoresist film PR2 is formed, which covers the low-withstand-voltage transistor region 1B, the high-withstand-voltage transistor region 1C, the sidewall-like polysilicon film PS2, and the top of the polysilicon film PS1 in part of the memory cell region 1A. An end of the photoresist film PR2 also covers the top of an end of the polysilicon film PS1 adjacent to the sidewall-like polysilicon film PS2.

Subsequently, dry etching is performed with the photoresist film PR2 as a mask to process the polysilicon film PS1, thereby the control gate electrode CG including the polysilicon film PS1 in the memory cell region 1A is formed. Patterning similar to that in the step described with FIGS. 5 to 8 is performed. Hence, the sidewall of the control gate electrode CG partially has a constricted shape. Such a patterning step is performed such that the polysilicon film PS1 adjacent to the sidewall-like polysilicon film PS2 remains on the element isolating region EI, and the sidewall of the polysilicon film PS1 has a constricted shape.

Subsequently, dry etching is performed with the photoresist film PR2 as a mask to remove the ONO film ON exposed from the control gate electrode CG, thereby the main surface of the semiconductor substrate SB in the memory cell region 1A is exposed. Subsequently, ion implantation is performed with the photoresist film PR2 as a mask to form a pair of extension regions EX in the main surface of the semiconductor substrate SB in the memory cell region 1A.

Figure 24:
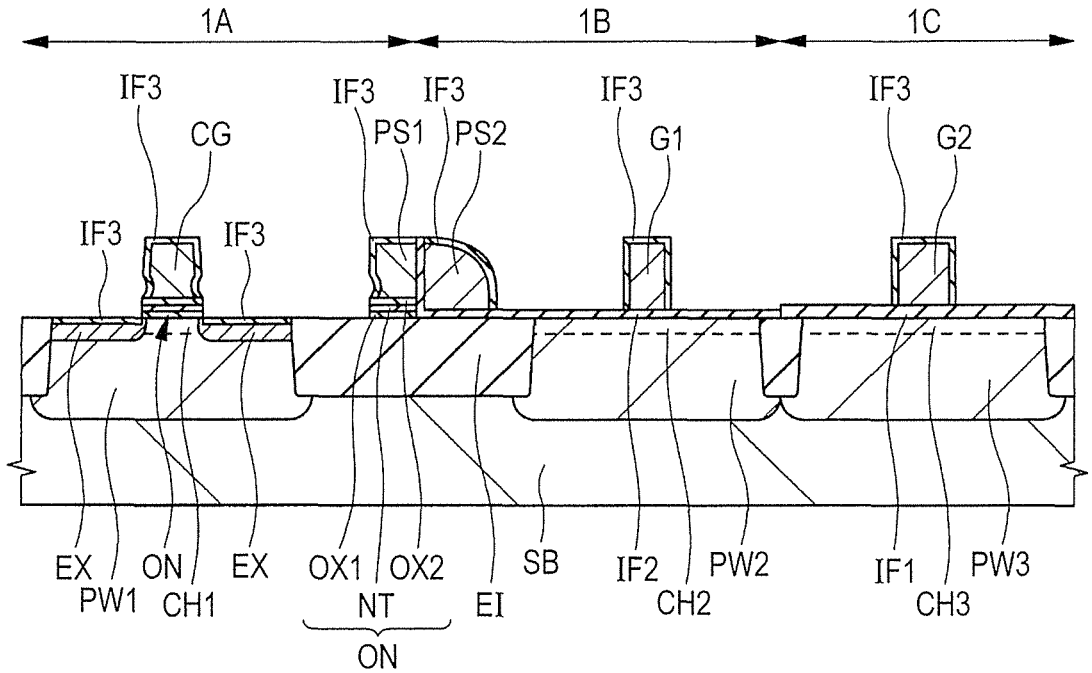
FIG. 24 is a sectional view of the semiconductor device during the manufacturing process following FIG. 23.

Subsequently, as illustrated in FIG. 24, the photoresist film PR2 is removed, and then dry oxidation is performed as in the step described with FIGS. 12 to 14. Consequently, the sidewall and the top of each of the control gate electrode CG, the gate electrode G1, and the gate electrode G2 are oxidized, and the insulating film IF3 including a silicon oxide film is formed. The insulating film IF3 is also formed over the exposed surface of each of the sidewall-like polysilicon film PS2 formed on the element isolating region EI and the polysilicon film PS1 adjacent to the polysilicon film PS2.

The insulating film IF3 is also formed over the main surface of the semiconductor substrate SB exposed in the memory cell region 1A.

Figure 25:
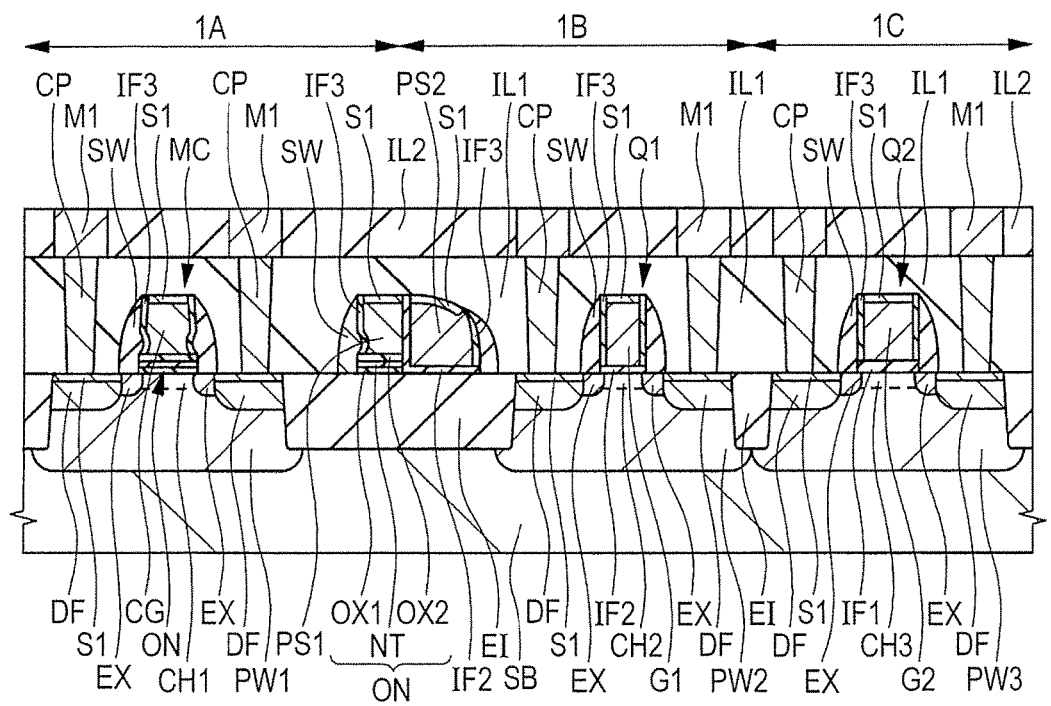
FIG. 25 is a sectional view of the semiconductor device during the manufacturing process following FIG. 24.

Subsequently, as illustrated in FIG. 25, steps similar to those described with FIGS. 15 to 17 are performed, thereby the semiconductor device of the first modification is completed. In the semiconductor device of the first modification, dry etching is performed as in the steps described with FIGS. 5 to 9 to form a constriction in the sidewall of the control gate electrode CG, and then dry oxidation treatment is performed as in the step described with FIGS. 12 to 14. It is therefore possible to greatly recess the sidewall of the control gate electrode CG having the constricted shape. This makes it possible to provide effects similar to the effects of the method of manufacturing the semiconductor device as described with FIGS. 1 to 17 and of the semiconductor device formed by the method.

A large quantity of heat is generated during formation of the ONO film ON, and the semiconductor substrate SB receives heat load. When the well, the channel region, or the silicon film that is provided on the substrate while containing an impurity, exists during formation of the ONO film ON, the impurity in the well or the like is affected by the heat load. This results in variations in properties of the transistor that is formed later and includes the well, the channel region, or the silicon film, leading to a reduction in reliability of the semiconductor device.

On the other hand, in the first modification, the ONO film ON is formed in the step described with FIG. 19. Subsequently, as illustrated in FIG. 20, the wells PW2 and PW3 and the channel regions CH2 and CH3 are formed in the peripheral region including the low-withstand-voltage transistor region 1B and the high-withstand-voltage transistor region 1C. Subsequently, the polysilicon film PS2 (see FIG. 21) for formation of the gate electrodes G1 and G2 (see FIG. 22) are formed.

Hence, the wells PW2 and PW3, the channel regions CH2 and CH3, and the polysilicon film PS2 in the peripheral region each receive a load by heat generated during formation of the ONO film ON, which prevents variations in distribution of the impurity in the wells or the like. This makes it possible to prevent variations in properties of the transistors Q1 and Q2 (see FIG. 25) in the peripheral region. Consequently, reliability of the semiconductor device can be further improved.

Second Modification

A method of manufacturing a semiconductor device of a second modification of the first embodiment is now described with FIGS. 26 to 32. FIGS. 26 to 32 are each a sectional view of a semiconductor device of the second modification during a manufacturing process of the semiconductor device, each of which illustrates the memory cell region 1A, the low-withstand-voltage transistor region 1B, and the high-withstand-voltage transistor region 1C as in FIG. 1.

In the steps described with FIGS. 1 to 17, the wells of the low-withstand-voltage transistor and the high-withstand-voltage transistor and the polysilicon film for the gate electrode are first formed, and then the ONO film is formed. In the second modification, however, the ONO film is first formed, and then the wells and the channel regions of the low-withstand-voltage transistor and the high-withstand-voltage transistor and the polysilicon film for the gate electrode are formed. In the second modification, the control gate electrode of the memory cell and the gate electrodes in the peripheral region are formed of one polysilicon film unlike the manufacturing methods described with FIGS. 1 to 25. The method of processing the control gate electrode, the shape of the control gate electrode, and the subsequent dry oxidation treatment, which each characterize the second embodiment, are the same as the steps described with FIGS. 1 to 17.

In the manufacturing process of the second modification, first, a step similar to the step described with FIG. 18 is performed to provide the semiconductor substrate SB, and form the element isolating regions EI, the insulating film IF4 covering the low-withstand-voltage transistor region 1B and the high-withstand-voltage transistor region 1C, the well PW1, and the channel region CH1.

Figure 26:
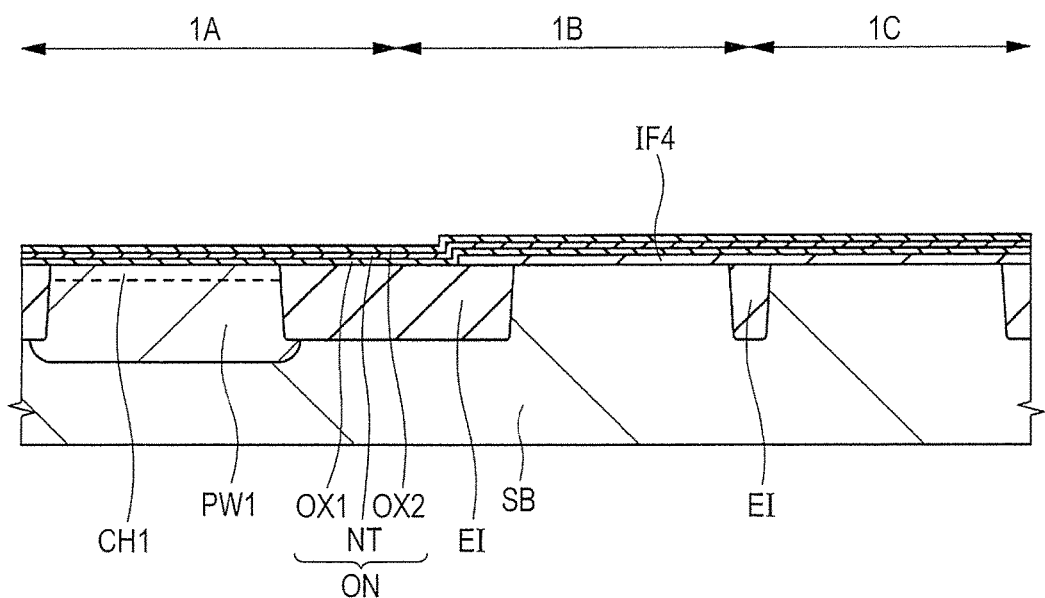
FIG. 26 is a sectional view of a semiconductor device of a second modification of the first embodiment during a manufacturing process of the semiconductor device.

Subsequently, as illustrated in FIG. 26, the ONO film ON is formed by, for example, a CVD process over the semiconductor substrate SB and the insulating film IF4.

Figure 27:
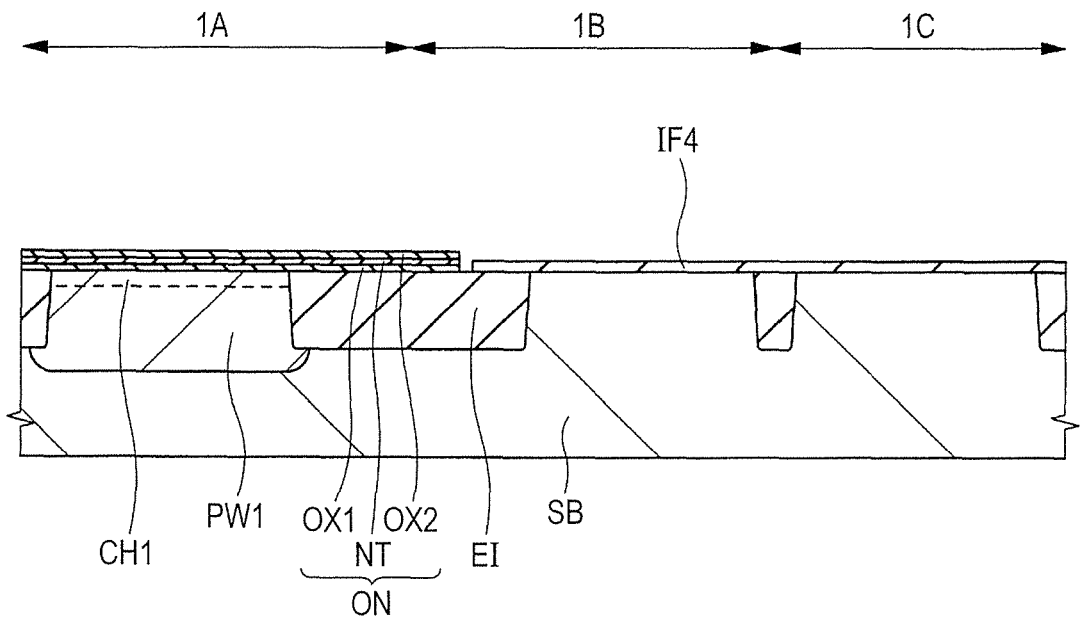
FIG. 27 is a sectional view of the semiconductor device during the manufacturing process following FIG. 26.

Subsequently, as illustrated in FIG. 27, the ONO film ON is removed from the low-withstand-voltage transistor region 1B and the high-withstand-voltage transistor region 1C with a photolithography technique and a dry etching process. Consequently, the insulating film IF4 is exposed. Subsequently, the p well PW2 and the channel region CH2 in the low-withstand-voltage transistor region 1B, and the p well PW3 and the channel region CH3 in the high-withstand-voltage transistor region 1C are formed using a photolithography technique and an ion implantation process.

Figure 28:
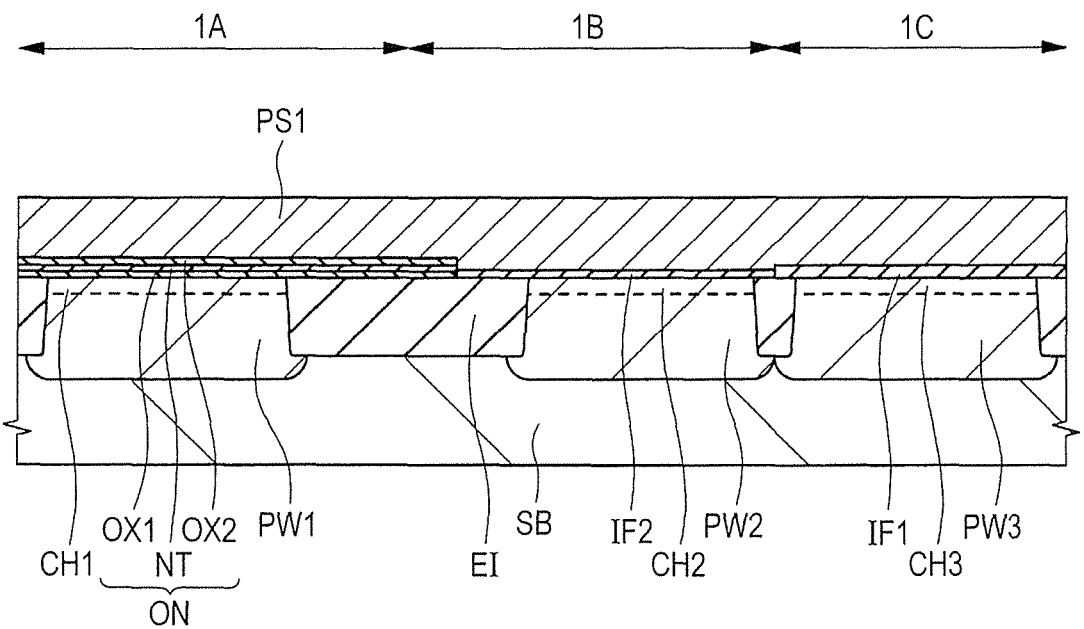
FIG. 28 is a sectional view of the semiconductor device during the manufacturing process following FIG. 27.

Subsequently, as illustrated in FIG. 28, the insulating film IF4 is removed by a wet etching process, and then the insulating film IF1, which covers the main surface of the semiconductor substrate SB and the ONO film ON, is formed using a CVD process, for example. Subsequently, the insulating film IF1 is patterned to remove the insulating film IF1 from any region other than the high-withstand-voltage transistor region 1C. Subsequently, the insulating film IF2 is formed so as to cover the exposed main surface of the semiconductor substrate SB in the low-withstand-voltage transistor region 1B. The insulating film IF2 is formed by a thermal oxidation process, for example.

Subsequently, the polysilicon film PS1 is formed by, for example, a CVD process on the main surface of the semiconductor substrate SB, and then an n impurity is implanted into the polysilicon film PS1. Specifically, a polysilicon film PS1 containing no impurity is formed, and then the impurity is implanted into the polysilicon film PS1. The polysilicon film PS1 may be formed as a silicon film that originally contains the n impurity. The polysilicon film PS1 covers the top of each of the ONO film ON, the insulating film IF2, and the insulating film IF1.

Figure 29:
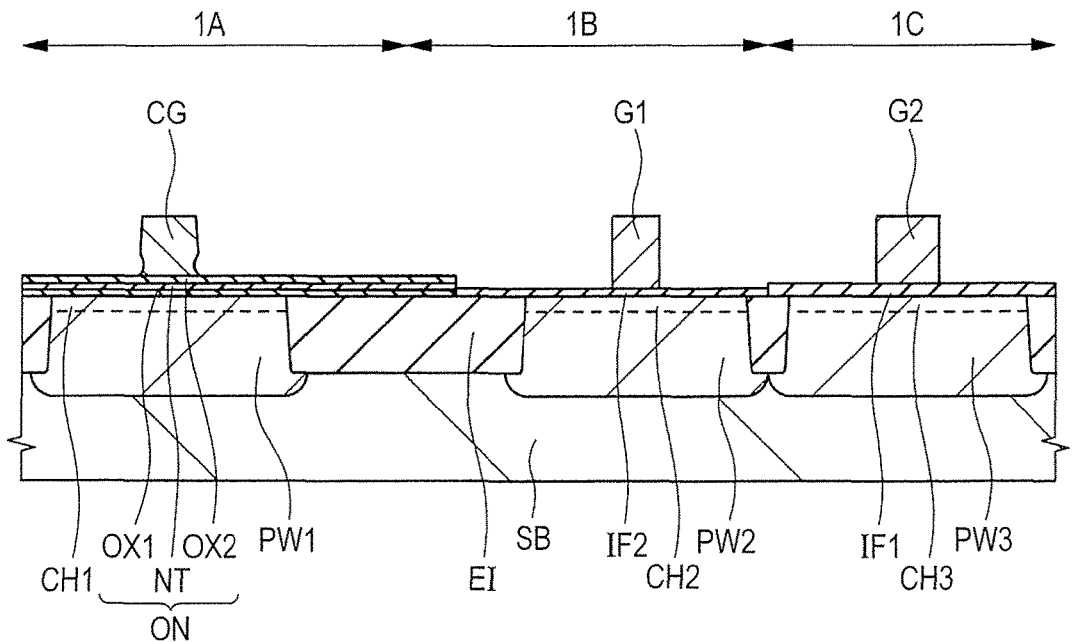
FIG. 29 is a sectional view of the semiconductor device during the manufacturing process following FIG. 28.

Subsequently, as illustrated in FIG. 29, the polysilicon film PS1 in each of the low-withstand-voltage transistor region 1B and the high-withstand-voltage transistor region 1C is etched back using a photolithography technique and a dry etching process, thereby each of the tops of the insulating films IF1 and IF2 is exposed. Consequently, the gate electrode G1 including the polysilicon film PS1 is formed in the low-withstand-voltage transistor region 1B, and the gate electrode G2 including the polysilicon film PS1 is formed in the high-withstand-voltage transistor region 1C. The dry etching step is performed while an undepicted photoresist film covers the polysilicon film PS1 in the memory cell region 1A.

Subsequently, the polysilicon film PS1 in the memory cell region 1A is etched back using a photolithography technique and a dry etching process, thereby the top of the ONO film ON is exposed. Consequently, the control gate electrode CG including the polysilicon film PS1 is formed in the memory cell region 1A. Such a dry etching step is performed in the same way as the step described with FIGS. 5 to 7. A constriction is therefore formed in the sidewall of the control gate electrode CG.

In the second modification, since the control gate electrode CG and the gate electrodes G1 and G2 are formed of one polysilicon film PS1, the control gate electrode CG and the gate electrodes G1 and G2 may be formed in the same patterning step. In such a case, however, if the constriction is formed in the sidewall of the control gate electrode CG to provide the above-described effect of preventing dielectric breakdown, the constriction is also formed in each of the sidewalls of the gate electrodes G1 and G2.

The low-withstand-voltage transistor particularly requires fast operation at low power unlike the memory cell. Hence, length of the gate electrode G1 in the gate length direction is defined to be small in such a transistor. If the constricted shape is formed in the sidewall of such a gate electrode G1, the effective gate length of the gate electrode G1 decreases due to a change in shape of the gate electrode G1, which probably deteriorates operating performance of the low-withstand-voltage transistor that is formed later while including the gate electrode G1. Such a difficulty may occur in a transistor having a relatively high withstand voltage.

In the second modification, therefore, the control gate electrode CG and the gate electrodes G1 and G2 are separately formed in different processing steps. This makes it possible to prevent variations in properties of the low-withstand-voltage transistor due to formation of the constriction in the sidewall of the gate electrode G1, for example. Consequently, reliability of the semiconductor device can be improved.

Either of the step of forming the control gate electrode CG through processing of the polysilicon film PS1 and the step of forming the gate electrodes G1 and G2 through processing of the polysilicon film PS1 may be first performed.

The control gate electrode CG and the gate electrodes G1 and G2 are formed of the same polysilicon film PS1 (see FIG. 28) and thus have the same thickness. The polysilicon film PS1 to be the control gate electrode CG later, the polysilicon film PS1 to be the gate electrode G1 later, and the polysilicon film PS1 to be the gate electrode G2 later have the same thickness at least at a point where the structure shown in FIG. 28 is given.

Hence, as with the third comparative example shown in FIGS. 46 to 50, when the control gate electrode CG having a flat sidewall is formed, the dry etching step for forming the control gate electrode CG is performed under the same condition as that of the dry etching step for forming the gate electrodes G1 and G2. Specifically, the soft-landing etching described with FIG. 46 is performed under an etching condition of the same number of seconds for formation of any of the control gate electrode CG and the gate electrodes G1 and G2. The soft-landing etching is performed for, for example, 65 sec for each of the step of forming the gate electrodes G1 and G2 and the step of forming the control gate electrode CG in the third comparative example.

On the other hand, in the second modification, as described with FIG. 7, when the control gate electrode CG is formed, the soft-landing etching is performed for 95 sec to form a constriction in the sidewall of the control gate electrode CG. When the gate electrodes G1 and G2 are formed, the soft-landing etching is performed for 65 sec to flatten the sidewalls of the gate electrodes G1 and G2. Specifically, the dry etching, which processes the polysilicon film PS1 to form the control gate electrode CG, is performed for a longer time than the dry etching that processes the polysilicon film PS1 to form the gate electrodes G1 and G2.

Consequently, the control gate electrode CG having the constricted shape and the gate electrodes G1 and G2 each having the flat sidewall can be separately formed. This makes it possible to allow the memory cell having the control gate electrode CG to provide an effect of preventing dielectric breakdown, and possible to prevent variations in properties due to variations in gate length of each of the gate electrodes G1 and G2 in the low-withstand-voltage transistor and the high-withstand-voltage transistor.

When the polysilicon film for formation of the control gate electrode and the polysilicon film for formation of the gate electrodes in the peripheral region are formed in different steps, since such polysilicon films may have different thicknesses, etching time for formation of the control gate electrode may not simply compared to etching time for formation of the gate electrodes.

Figure 30:
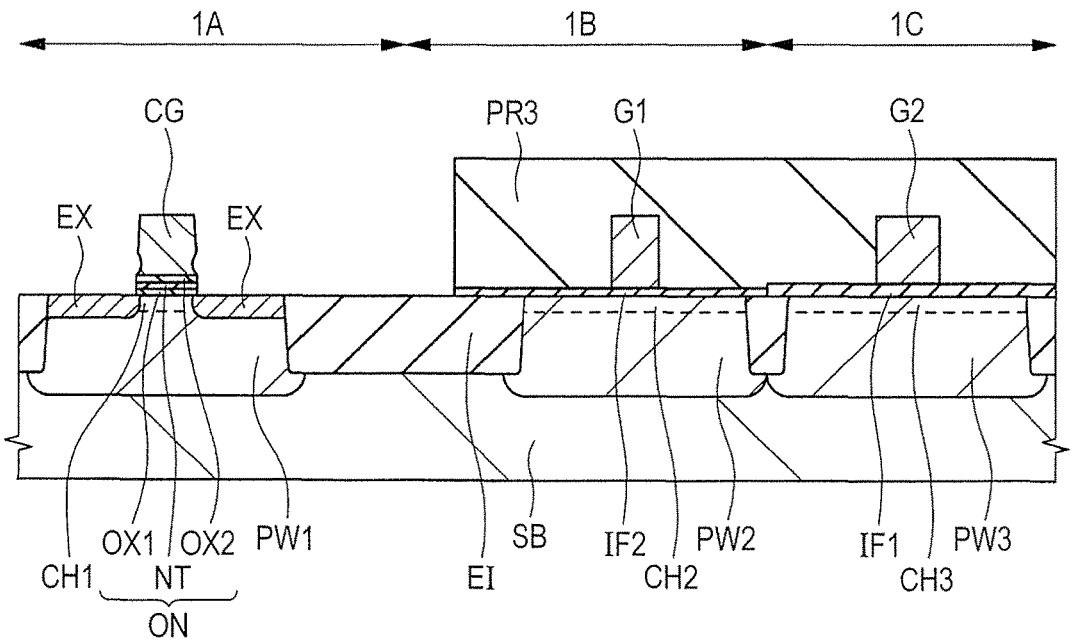
FIG. 30 is a sectional view of the semiconductor device during the manufacturing process following FIG. 29.

Subsequently, as illustrated in FIG. 30, a photoresist film PR3, which covers the low-withstand-voltage transistor region 1B and the high-withstand-voltage transistor region 1C and exposes the memory cell region 1A, is formed, and then a step similar to the step described with FIG. 23 is performed. Specifically, dry etching is performed with the photoresist film PR3 as a mask to process the ONO film ON, and then ion implantation is performed with the photoresist film PR3 and the control gate electrode CG as a mask, thereby the extension regions EX are formed in the memory cell region 1A.

Figure 31:
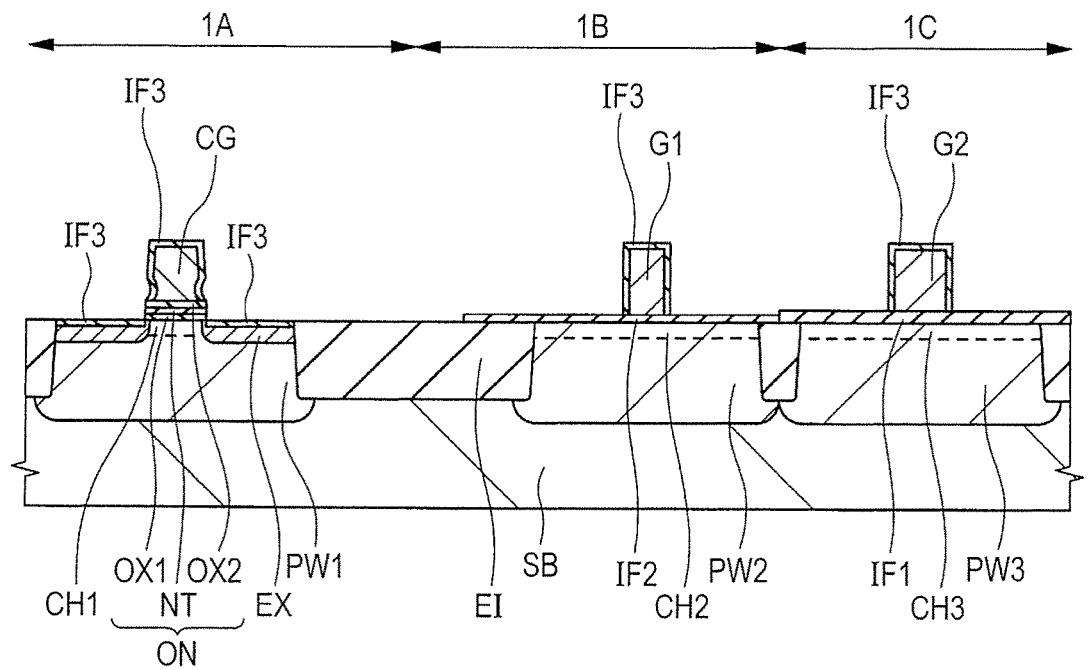
FIG. 31 is a sectional view of the semiconductor device during the manufacturing process following FIG. 30.

Subsequently, as illustrated in FIG. 31, the photoresist film PR3 is removed, and then dry oxidation is performed as in the step described with FIGS. 12 to 14. Consequently, the sidewall and the top of each of the control gate electrode CG, the gate electrode G1, and the gate electrode G2 are oxidized, and the insulating film IF3 including a silicon oxide film is formed. The insulating film IF3 is also formed over the main surface of the semiconductor substrate SB exposed in the memory cell region 1A.

Figure 32:
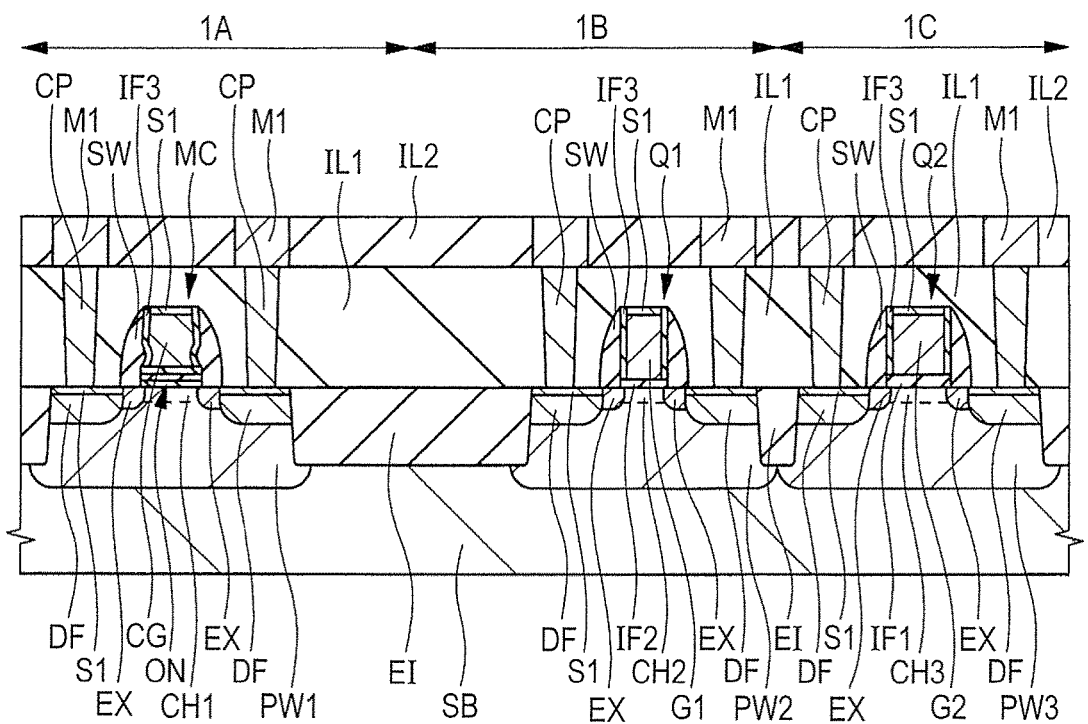
FIG. 32 is a sectional view of the semiconductor device during the manufacturing process following FIG. 31.

Subsequently, as illustrated in FIG. 32, steps similar to those described with FIGS. 15 to 17 are performed, thereby the semiconductor device of the second modification is completed. In the semiconductor device of the second modification, dry etching is performed as in the steps described with FIGS. 5 to 9 to form a constriction in the sidewall of the control gate electrode CG, and then dry oxidation treatment is performed as in the step described with FIGS. 12 to 14. It is therefore possible to greatly recess the sidewall of the control gate electrode CG having the constricted shape. This makes it possible to provide effects similar to the effects of the method of manufacturing the semiconductor device as described with FIGS. 1 to 17 and the semiconductor device formed by the method.

In the second modification, the ONO film ON is formed in the step described with FIG. 26. Subsequently, as illustrated in FIG. 20, the wells PW2 and PW3 and the channel regions CH2 and CH3 are formed in the peripheral region including the low-withstand-voltage transistor region 1B and the high-withstand-voltage transistor region 1C. Subsequently, the polysilicon film PS1 (see FIG. 28) for formation of the control gate electrode CG and the gate electrodes G1 and G2 (see FIG. 29) are formed.

Hence, the wells PW2 and PW3, the channel regions CH2 and CH3, and the polysilicon film PS1 in the peripheral region each receive a load by heat generated during formation of the ONO film ON, which prevents variations in distribution of the impurity in the wells and the like. This makes it possible to prevent variations in properties of the memory cell MC (see FIG. 32) and of the transistors Q1 and Q2 (see FIG. 32) in the peripheral region. Consequently, reliability of the semiconductor device can be further improved.

In the second modification, the control gate electrode of the memory cell and the gate electrodes in the peripheral region are formed of one polysilicon film unlike the manufacturing methods described with FIGS. 1 to 25. This makes it possible to decrease the number of times of steps of forming the polysilicon film and the number of times of steps of implanting the impurity into the polysilicon film. Consequently, the manufacturing process of the semiconductor device can be simplified, and manufacturing cost of the semiconductor device can be reduced.

Second Embodiment

Figure 33:
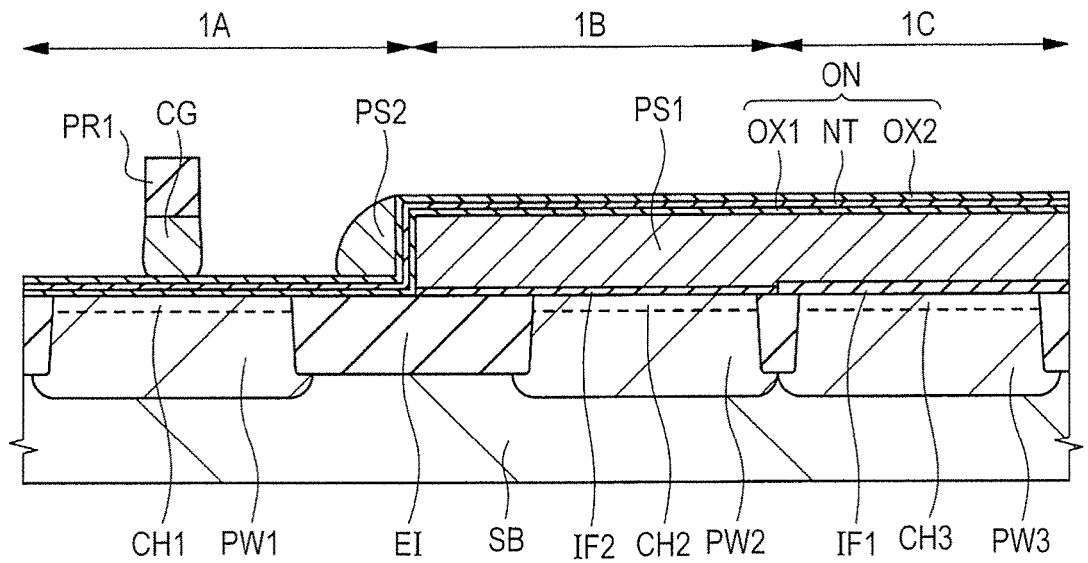
FIG. 33 is a sectional view of a semiconductor device of a second embodiment during a manufacturing process of the semiconductor device.
Figure 34:
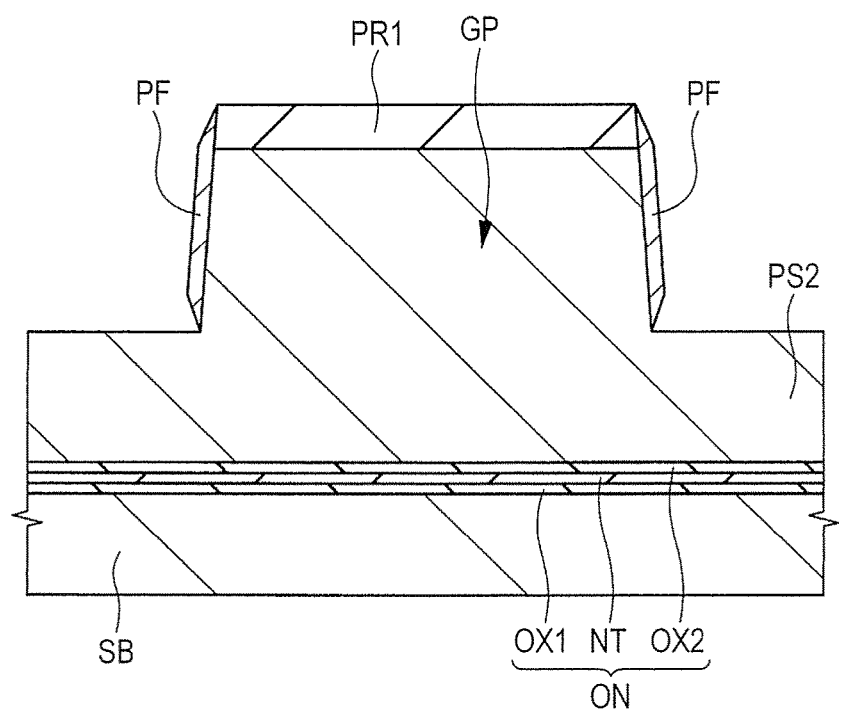
FIG. 34 is a sectional view of the semiconductor device of the second embodiment during the manufacturing process.
Figure 35:
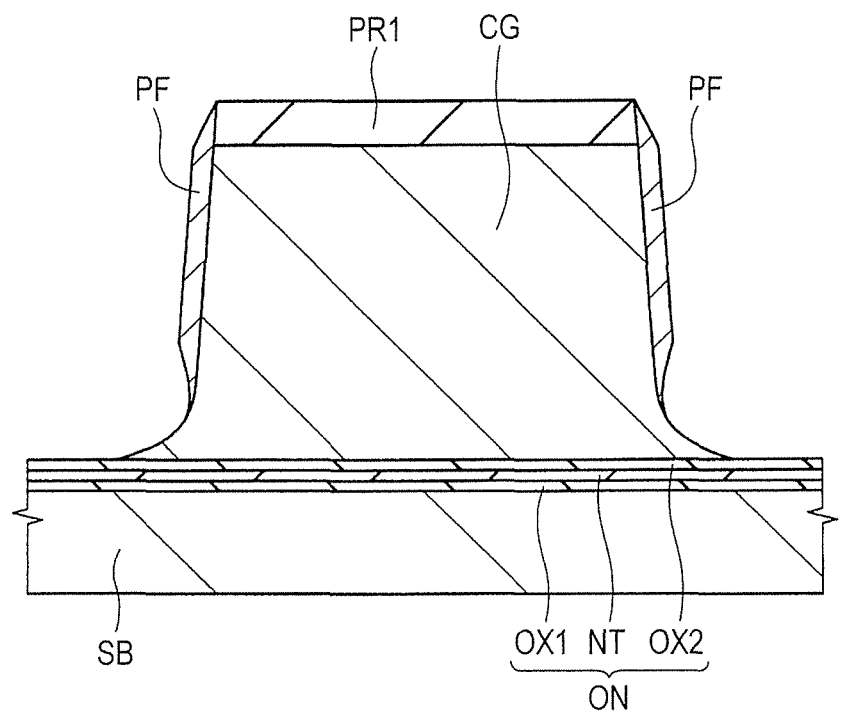
FIG. 35 is a sectional view of the semiconductor device during the manufacturing process following FIG. 34.
Figure 36:
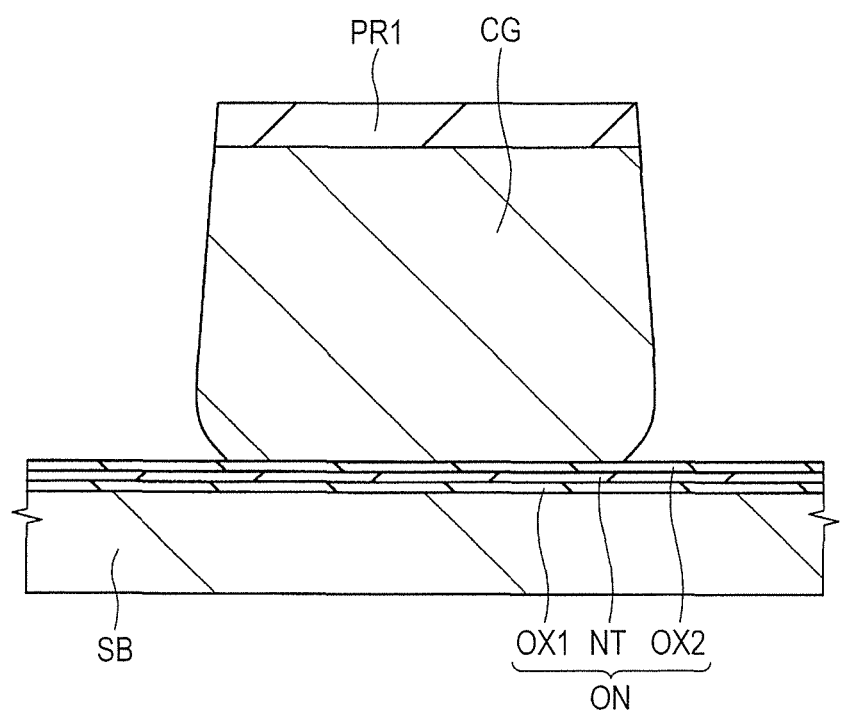
FIG. 36 is a sectional view of the semiconductor device during the manufacturing process following FIG. 35.
Figure 37:
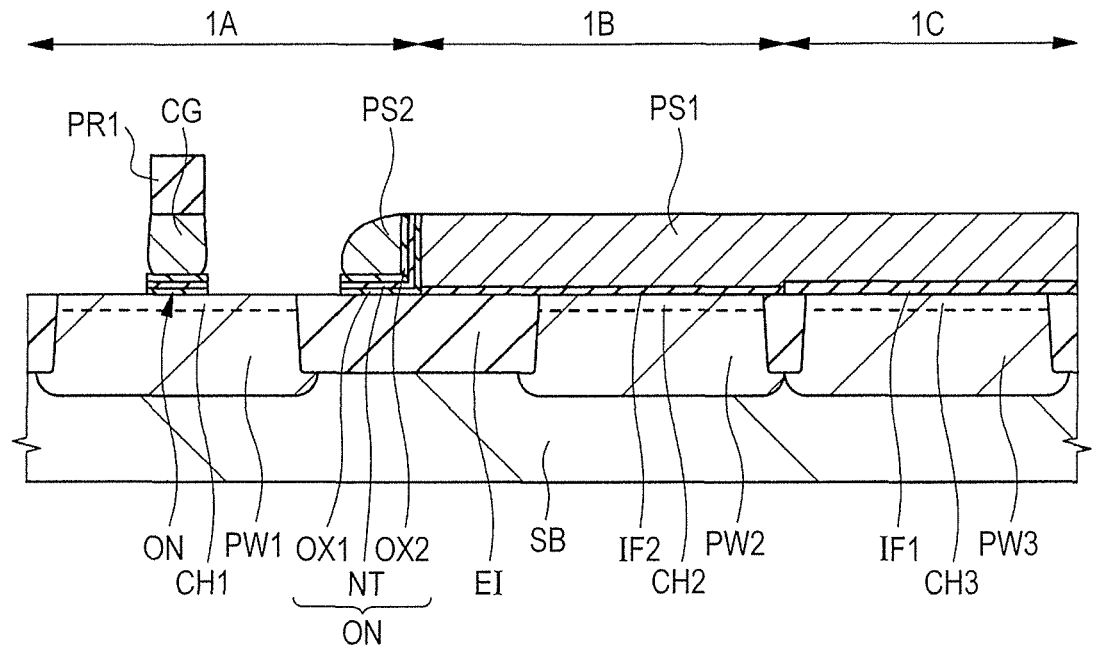
FIG. 37 is a sectional view of the semiconductor device during the manufacturing process following FIG. 36.
Figure 38:
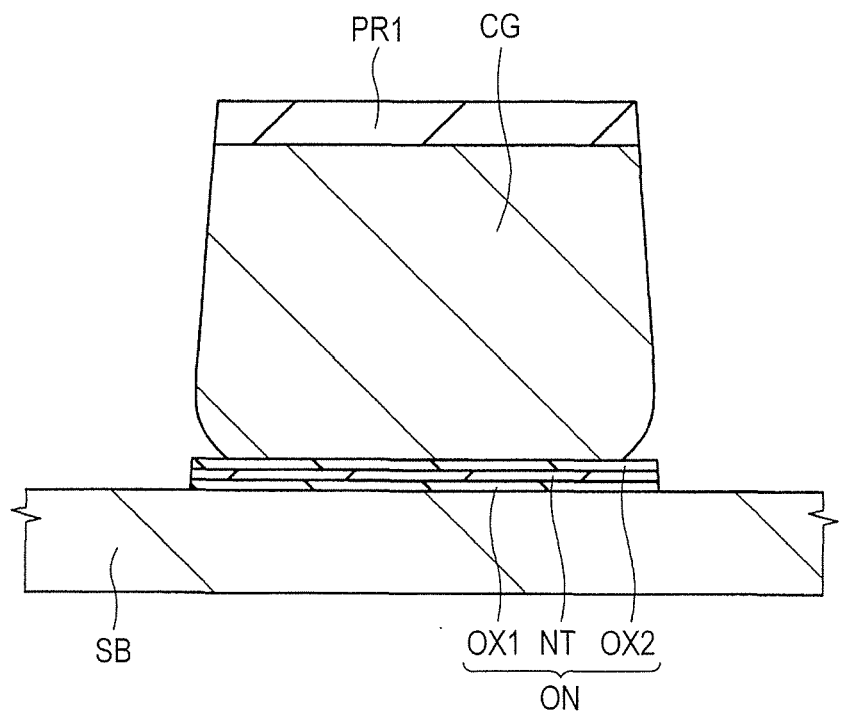
FIG. 38 is a sectional view of the semiconductor device during the manufacturing process following FIG. 36.
Figure 39:
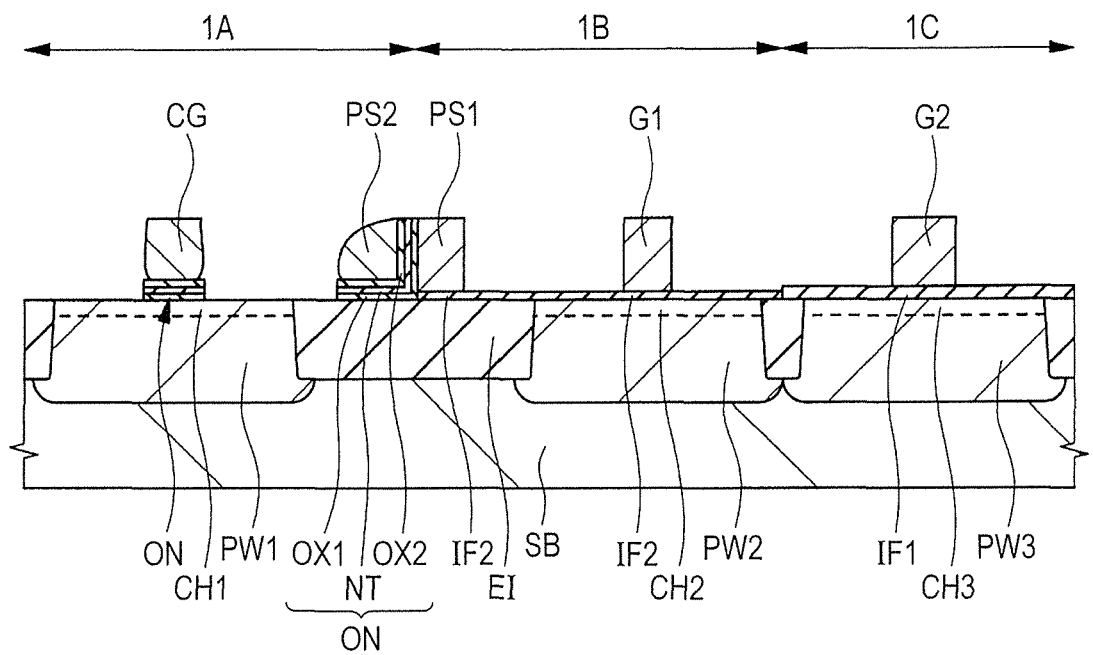
FIG. 39 is a sectional view of the semiconductor device during the manufacturing process following FIG. 38.
Figure 40:
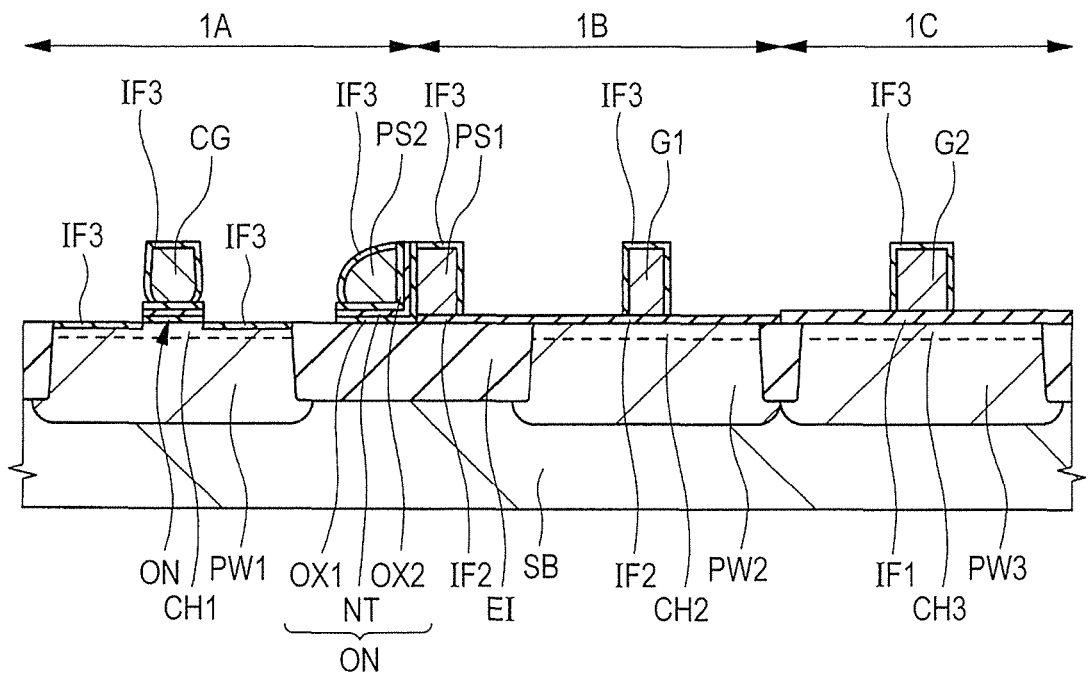
FIG. 40 is a sectional view of the semiconductor device during the manufacturing process following FIG. 39.
Figure 41:
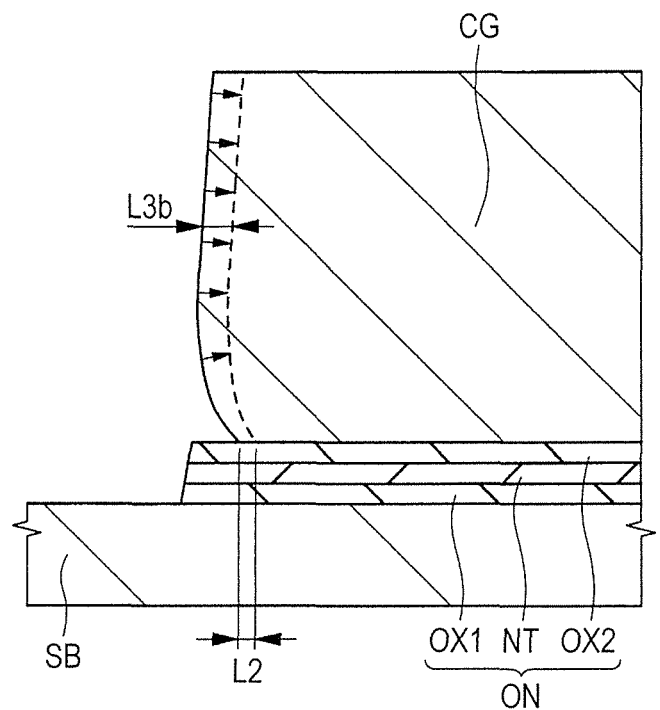
FIG. 41 is a sectional view of the semiconductor device during the manufacturing process following FIG. 39.
Figure 42:
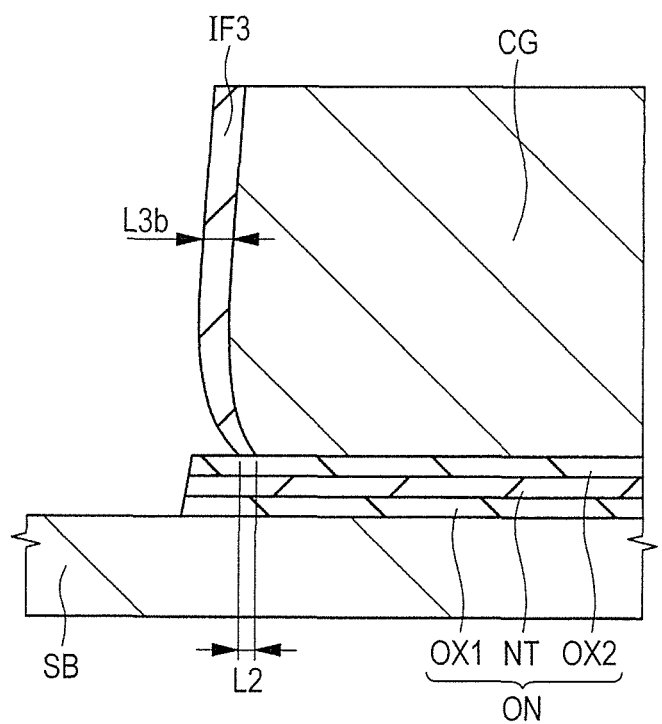
FIG. 42 is a sectional view of the semiconductor device during the manufacturing process following FIG. 41.

A method of manufacturing the semiconductor device of a second embodiment is now described with FIGS. 33 to 43. FIGS. 33 to 43 are each a sectional view of the semiconductor device of the second embodiment during a manufacturing process of the semiconductor device. Each of FIGS. 33, 37, 39, 40, and 43 illustrates sections of the memory cell region 1A, the low-withstand-voltage transistor region 1B, and the high-withstand-voltage transistor region 1C as in FIG. 1. FIGS. 34 to 36 each show an enlarged sectional view of a region in which a control gate electrode is formed as in FIGS. 6 to 8. FIG. 38 shows an enlarged sectional view of a region in which the control gate electrode has been formed as in FIG. 10. FIGS. 41 and 42 each show an enlarged sectional view of the region in which the control gate electrode has been formed as in FIGS. 13 and 14.

In the first embodiment, it has been described that the control gate electrode CG having the constriction in its sidewall is formed and the sidewall is oxidized. In the second embodiment, it is described that a control gate electrode is formed such that its width in the gate length direction becomes smaller as approaching the bottom of the control gate electrode.

In the second embodiment, first, steps similar to those described with FIGS. 1 to 4 are performed. Subsequently, as illustrated in FIG. 33, a photoresist film PR1, which covers part of the top of the polysilicon film PS2 in the memory cell region 1A, is formed, and then dry etching is performed with the photoresist film PR1 as a mask. Consequently, the top of the ONO film ON is exposed in each of the memory cell region 1A, the low-withstand-voltage transistor region 1B, and the high-withstand-voltage transistor region 1C, and a control gate electrode CG including the polysilicon film PS2 is formed directly below the photoresist film PR1. A sidewall-like polysilicon film PS2 remains on the sidewall of the polysilicon film PS1 with the ONO film ON in between.

The control gate electrode CG in the second embodiment has a shape different from the shape of the control gate electrode CG described with FIGS. 5 to 8. A formation process of the control gate electrode CG is now described with FIGS. 34 to 36. FIGS. 34 to 36 are each an enlarged sectional view for detailed description of the step described with FIG. 33.

Specifically, the photoresist film PR1 is thus formed. Subsequently, as illustrated in FIG. 34, dry etching (main etching) is performed with the photoresist film PR1 as a mask, thereby the polysilicon film PS2 is etched back to its intermediate depth. This step is the same as the step described with FIG. 6. A gate pattern GP as part of the polysilicon film PS2 is formed directly below the photoresist film PR1. Each of the sidewalls of the gate pattern GP and the photoresist film PR1 is covered with a protective film PF formed during the main etching step.

Subsequently, as illustrated in FIG. 35, soft-landing etching is performed, thereby the polysilicon film PS2 beside the gate pattern GP is removed and the top of the ONO film ON is exposed. Consequently, the gate pattern GP including the polysilicon film PS2 is left on the ONO film ON. At this time, soft-landing etching time is short compared with the case where the entire sidewall of the control gate electrode to be formed later is formed flat at an angle possibly perpendicular to the main surface of the semiconductor substrate SB. That is, the soft-landing etching in the second embodiment is performed for a period shorter than the soft-landing etching in the third comparative example described with FIG. 46. Specifically, the soft-landing etching is performed for 45 sec in the second embodiment.

In other words, etching amount is decreased compared with the case where the entire sidewall of the control gate electrode is formed flat at an angle possibly perpendicular to the main surface of the semiconductor substrate SB. Since such etching has a selectivity to silicon oxide, most of the silicon oxide film OX2 is not removed.

The sidewall of the gate pattern GP has a shape in which the skirt of the sidewall is expanded in the vicinity of the ONO film ON. Specifically, a fourth sidewall, which is formed by the soft-landing etching described with FIG. 35, in the sidewall of the gate pattern GP has an inclination angle that increases at a point closer to the top of the ONO film ON compared with the inclination angle of the first sidewall formed by main etching described with FIG. 34. In other words, width of the gate pattern GP increases as approaching the ONO film ON. In this way, the gate pattern GP has a skirt part between the fourth sidewall and the ONO film ON. This is because the soft-landing etching is finished in a relatively short time, thereby the polysilicon film PS2 is not sufficiently etched and remains in the vicinity of the ONO film ON.

Although the first sidewall is covered with the protective film PF, the fourth sidewall is exposed from the protective film PF or covered with a protective film PF thinner than the protective film PF covering the first sidewall. This is because the soft-landing etching is finished in a short time. Specifically, etching is finished before a polymer produced through etching of the polysilicon film PS2 adheres to the fourth sidewall of the gate pattern GP shaped from the polysilicon film PS2; hence, such a skirt part is not sufficiently covered with the protective film PF.

Subsequently, as illustrated in FIG. 36, overetching is performed as in the dry etching step described with FIG. 8. Consequently, the protective film PF is removed, and the control gate electrode CG including the gate pattern GP is formed. At this time, the skirt part including the forth sidewall, which is exposed from the protective film PF or covered with an extremely thin protective film, is not protected by the protective film PF; hence, the skirt part is removed by the overetching.

As a result, the polysilicon film that is not covered with the protective film PF is removed, thereby a portion of the sidewall of the control gate electrode CG, i.e., a fifth sidewall as part of the lower side of the sidewall, is inclined in a direction opposite to a direction of the first sidewall. That is, the fifth sidewall as part of one sidewall of the control gate electrode CG is inclined in a direction opposite to a direction toward the other sidewall of the control gate electrode CG. In other words, the fifth sidewall is inclined to the outside of the control gate electrode CG in the gate length direction from a portion at which the fifth sidewall is in contact with the top of the ONO film ON.

The control gate electrode CG subjected to such overetching has the first sidewall and the fifth sidewall continued to the lower end of the first sidewall, and the lower end of the fifth sidewall is in contact with the top of the ONO film ON.

The fifth sidewall, i.e., part of the polysilicon film configuring the control gate electrode CG, is thus formed by partially removing a portion directly below the first sidewall, and is inclined at an angle larger than 90° with respect to each of the main surface of the semiconductor substrate SB and the top of the ONO film ON. That is, an angle defined by the fifth sidewall and the bottom of the control gate electrode CG is an obtuse angle, or larger than 90°. That is, the fifth sidewall has a reversely tapered shape.

In other words, no control gate electrode CG exists between the fifth sidewall and the top of the ONO film ON directly below the fifth sidewall. In addition, the fifth sidewall overhangs in an eaves shape above the top of the ONO film ON directly below the fifth sidewall. The fifth sidewall is the same as the second sidewall of the first embodiment in having such a reversely tapered shape, but is different from the second sidewall in that the fifth sidewall is in contact with the top of the ONO film ON. Hence, the control gate electrode CG of the second embodiment does not have the skirt part near the top of the ONO film ON unlike the first embodiment.

The length in the gate length direction of the control gate electrode CG gradually increases from the top of the control gate electrode CG to a predetermined position between the top and the bottom of the control gate electrode CG, and gradually decreases from the predetermined position to the bottom of the control gate electrode CG. Specifically, the length in the gate length direction of the control gate electrode CG at the predetermined position is larger than the length in the gate length direction of the control gate electrode CG at the top of the control gate electrode CG, and is larger than the length in the gate length direction of the control gate electrode CG at the bottom of the control gate electrode CG.

Subsequently, as illustrated in FIGS. 37 and 38, dry etching is performed with the photoresist film PR1 as a mask, thereby the ONO film ON exposed from the control gate electrode CG and the polysilicon film PS2 is removed. However, the ONO film ON directly below the control gate electrode CG overlaps with the control gate electrode CG in planar view, and is therefore substantially not removed. That is, the ONO film ON is removed from a region in which the ONO film ON does not overlap with the control gate electrode CG in planar view. Consequently, the main surface of the semiconductor substrate SB in the memory cell region 1A, the top of the element isolating region EI, and the top of the polysilicon film PS1 in each of the low-withstand-voltage transistor region 1B and the high-withstand-voltage transistor region 1C are exposed. FIG. 38 illustrates enlargedly illustrates the control gate electrode CG and the ONO film ON in the memory cell region 1A in the structure illustrated in FIG. 37.

As illustrated in FIG. 38, an angle defined by the sidewall of the ONO film ON and the main surface of the semiconductor substrate SB directly below the ONO film ON is 90° or smaller. That is, the angle is a right angle or an acute angle. A corner as a boundary between the top and the sidewall of the ONO film ON is not in contact with the control gate electrode CG. This is because dry etching is performed with the control gate electrode CG, having the sidewall overhanging in the eaves shape, as a mask, and resultantly the ONO film ON directly below the fifth sidewall is not removed, i.e., remains. That is, a portion, at which the fifth sidewall is in contact with the ONO film ON, is separated from the end of the top of the ONO film ON in the gate length direction. In other words, the end of the ONO film ON overhangs to the outside of the control gate electrode CG in the gate length direction with respect to an interface between the bottom of the control gate electrode CG and the top of the ONO film ON.

Subsequently, as illustrated in FIG. 39, a step similar to the step described with FIG. 11 is performed to process the polysilicon film PS1, thereby the gate electrodes G1 and G2 are formed.

Subsequently, as illustrated in FIG. 40, exposed surfaces of the control gate electrode CG, the polysilicon films PS1 and PS2, and the gate electrodes G1 and G2 are oxidized by a dry oxidation process. This results in formation of the insulating film IF3 covering the sidewalls and the tops of the control gate electrode CG, the polysilicon films PS1 and PS2, and the gate electrodes G1 and G2. The insulating film IF3 has a thickness of 2 to 3 nm, for example. The insulating film IF3 is also formed on the main surface of the semiconductor substrate SB exposed in the memory cell region 1A.

However, oxygen is less likely to be supplied to the fifth sidewall near the top of the ONO film ON. Hence, as illustrated in FIGS. 41 and 42, part of the insulating film IF3 covering the lower side of the fifth sidewall has a relatively small thickness. Consequently, a length L2 in the gate length direction of a surface, at which the insulating film IF3 covering the fifth sidewall is in contact with the top of the ONO film ON, is shorter than a length L3b in the gate length direction of the insulating film IF3 formed through oxidation of the first sidewall, for example.

FIGS. 41 and 42 are each an enlarged sectional view for detailed description of the oxidation step described with FIG. 40. FIG. 41 illustrates, by a broken line, a boundary between a region in which the sidewall of the control gate electrode CG is oxidized and a region in which the control gate electrode CG is not oxidized.

Through such an oxidation step, the sidewall of the control gate electrode CG is recessed toward the middle of the control gate electrode CG. Hence, the end of the control gate electrode CG in contact with the top of the ONO film ON is further separated from the end of the top of the ONO film ON compared with before the oxidation step. Consequently, the end of the ONO film ON more projects than the end of the bottom of the control gate electrode CG to the outside of the control gate electrode CG in the gate length direction. The control gate electrode CG subjected to the oxidation step also has a shape such that the length in the gate length direction of the control gate electrode CG gradually decreases from the predetermined position between the top and the bottom of the control gate electrode CG to the bottom. The interface between the insulating film IF3 and the ONO film ON is separated from the end of the top of the ONO film ON.

Figure 43:
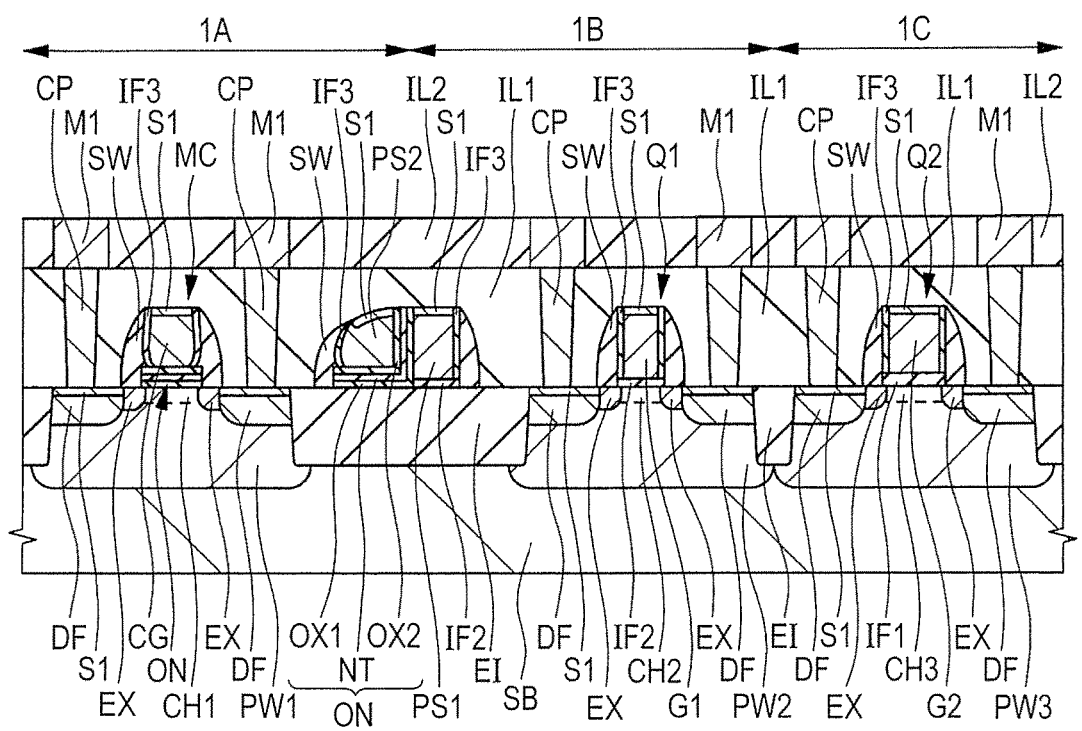
FIG. 43 is a sectional view of the semiconductor device during the manufacturing process following FIG. 42.

Subsequently, as illustrated in FIG. 43, steps similar to those described with FIGS. 15 to 17 are performed, thereby the semiconductor device of the second embodiment is completed.

In the second embodiment, as described with FIGS. 33 to 36, soft-landing etching time is reduced, thereby the lower side of the sidewall of the gate pattern GP is exposed from the protective film PF, and then overetching is performed, thereby the control gate electrode CG is formed so as to have a width being narrowed at the bottom. The ONO film ON, which is processed by anisotropic etching with such a control gate electrode CG as a mask, is terminated at a position away from the bottom of the control gate electrode CG in the gate length direction.

In the second embodiment, therefore, the end of the ONO film ON can be more projected than the control gate electrode CG in the gate length direction; hence, occurrence of dielectric breakdown can be prevented unlike the first comparative example described with FIG. 44. Consequently, reliability of the semiconductor device can be improved.

In addition, oxidation treatment having a relatively high oxidation ability is not necessary unlike the second comparative example described with FIG. 45; hence, operating performance of the memory cell having the control gate electrode CG can be prevented from being deteriorated. In addition, properties of transistors can be prevented from being varied due to the well or the like that receives a load caused by high temperature. Consequently, reliability of the semiconductor device can be improved.

In the second embodiment, unlike the first embodiment, even if oxidation treatment oxidizing the sidewall of the control gate electrode CG is not performed after formation of the control gate electrode CG, the bottom of the control gate electrode CG is separated from the end of the top of the ONO film ON at a time point where the control gate electrode CG is formed as illustrated in FIG. 33. In the dry oxidation step described with FIGS. 40 to 42, therefore, it is not necessary to perform excessive oxidation for prevention of dielectric breakdown. Hence, heat load to the semiconductor substrate SB can be reduced. It is therefore possible to prevent properties of transistors from being varied due to the well or the like that receives a load caused by high temperature.

In the second embodiment, an angle defined by the bottom of the control gate electrode CG and the fifth sidewall is an obtuse angle rather than an acute angle. In other words, a corner between the bottom of the control gate electrode CG and the fifth sidewall is rounded. It is therefore possible to prevent electric field concentration at the corner. Consequently, dielectric breakdown can be prevented from occurring between the control gate electrode CG and the semiconductor substrate SB during operation of the memory cell MC (see FIG. 43). Hence, reliability of the semiconductor device can be improved.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

For example, in the second embodiment, it has been described that the ONO film is formed after formation of the wells in the peripheral region as with the steps described with FIGS. 1 to 17 in the first embodiment. However, a manufacturing process, in which the wells and the like in the peripheral region are formed after formation of the ONO film as in the modifications 1 and 2 of the first embodiment, may be applied to the second embodiment.

In the second modification, it has been described with FIGS. 26 to 32 that etching for formation of the control gate electrode is performed for a longer time than etching for formation of other gate electrodes. On the other hand, when the second modification is applied to the second embodiment as described above, etching time for formation of the control gate electrode is shorter than etching time for formation of other gate electrodes.

What is claimed is:
1. A method of manufacturing a semiconductor device, comprising the steps of:
    (a) providing a semiconductor substrate;
    (b) forming a first insulating film including a charge accumulating part over a main surface of the semiconductor substrate;
    (c) forming a conductive film over the first insulating film;
    (d) processing the conductive film to form a control gate electrode including the conductive film, and exposing a top of the first insulating film from the conductive film;
    (e) removing the first insulating film exposed from the control gate electrode in planar view to expose the main surface of the semiconductor substrate from the first insulating film; and
    (f) forming a pair of first source and drain regions in the main surface of the semiconductor substrate beside the control gate electrode, thereby forming a nonvolatile memory cell including the first source and drain regions, the control gate electrode, and the first insulating film,
    wherein an angle defined by a bottom of the control gate electrode and a sidewall of the control gate electrode in contact with the top of the first insulating film is larger than 90° and smaller than 180°.
2. The method according to claim 1, wherein the bottom of the control gate electrode and an end of the top of the first insulating film are separated from each other in a gate length direction of the control gate electrode.
3. The method according to claim 1, further comprising a step of:
    (e1) after the step (d), performing dry oxidation to form a second insulating film covering the sidewall of the control gate electrode.
4. The method according to claim 1, wherein the step (d) includes the steps of:
    (d1) forming a mask pattern over the conductive film;
    (d2) performing anisotropic etching on the conductive film exposed from the mask pattern, thereby etching the conductive film to expose the top of the first insulating film while forming a film including a material of the etched conductive film and covering a sidewall of the conductive film directly below the mask pattern, and
    (d3) performing etching with the mask pattern to remove part of the conductive film exposed from the film, thereby forming the control gate electrode including the conductive film.
5. The method according to claim 3, further comprising the steps of:
    (a1) after the step (a), introducing an impurity into the main surface of the semiconductor substrate in a first region, thereby forming a semiconductor region in the main surface of the semiconductor substrate, and
    (a2) after the step (a1) and before the step (e1), forming a field effect transistor over the semiconductor region,
    wherein in the step (b), the first insulating film is formed in a second region different from the first region.
6. The method according to claim 5,
    wherein in the step (b), the first insulating film is formed, and a third insulating film is formed over the semiconductor region,
    wherein in the step (c), the conductive film is formed over an area from a region on the first insulating film to a region on the third insulating film, wherein the step (a2) includes the steps of:

(d4) processing the conductive film in the first region to form a gate electrode including the conductive film; and (f1) forming a pair of second source and drain regions in the main surface of the semiconductor substrate beside the gate electrode to form a field effect transistor including the second source and drain regions and the gate electrode, and wherein time for anisotropic etching to process the conductive film in the step (d) is shorter than time for anisotropic etching to process the conductive film in the step (d4).

7. The method according to claim 1,
wherein in the step (c), a silicon oxide film and a silicon nitride film are formed in this order over each of the first source and drain regions, thereby the first insulating film including the silicon oxide film and the silicon nitride film is formed, and wherein the silicon nitride film configures the charge accumulating part.

8. A semiconductor device, comprising:
a semiconductor substrate;
a first insulating film that is formed over a main surface of the semiconductor substrate and includes a charge accumulating part;
a control gate electrode formed directly over the first insulating film;
a pair of source and drain regions formed on the main surface of the semiconductor substrate beside the control gate electrode; and
a second insulating film covering a first sidewall of the control gate electrode,
wherein the source and drain regions, the control gate electrode, and the first insulating film configure a nonvolatile memory cell,
wherein a recess formed in the first sidewall is in contact with a top of the first insulating film,
wherein a bottom of the control gate electrode which is in contact with the top of the first insulating film has an edge at which the first sidewall is in contact with the top of the first insulating film, and
wherein an end of the top of the first insulating film extends beyond the edge of the bottom of the control gate electrode in a gate length direction of the control gate electrode.

9. The semiconductor device according to claim 8, wherein a first angle defined by a second sidewall in contact with the top of the first insulating film, the second sidewall being part of the first sidewall, and the bottom of the control gate electrode is larger than 0° and smaller than 90°.

10. The semiconductor device according to claim 9,
wherein the first sidewall includes the second sidewall configuring a surface of the recess, a third sidewall that configures the surface of the recess and is located over the second sidewall, and a fourth sidewall located over the recess, and wherein a second angle defined by the third sidewall and the bottom of the control gate electrode is larger than 90° and smaller than 180°.

11. The semiconductor device according to claim 8, wherein a length over which the second insulating film is in contact with the first insulating film in the gate length direction is larger than a length in the gate length direction of the second insulating film that configures the first sidewall and is in contact with a fourth sidewall located over the recess.

12. The semiconductor device according to claim 8,
wherein the first insulating film includes a silicon oxide film and a silicon nitride film formed in this order over the semiconductor substrate, and wherein the silicon nitride film configures the charge accumulating part.

13. A semiconductor device, comprising:
a semiconductor substrate;
a first insulating film that is formed over a main surface of the semiconductor substrate and includes a charge accumulating part;
a control gate electrode formed directly over the first insulating film; and
a pair of source and drain regions formed in the main surface of the semiconductor substrate beside the control gate electrode,
wherein the source and drain regions, the control gate electrode, and the first insulating film configure a nonvolatile memory cell,
wherein a first angle defined by a second sidewall in contact with a top of the first insulating film, the second sidewall being part of the first sidewall, and a bottom of the control gate electrode is larger than 90° and smaller than 180°, and
wherein the bottom of the control gate electrode and an end of the top of the first insulating film are separated from each other in a gate length direction of the control gate electrode.

14. The semiconductor device according to claim 13, wherein a second angle defined by a third sidewall, the third sidewall configuring the first sidewall and located over the second sidewall, and the bottom of the control gate electrode is larger than 0° and smaller than 90°.

15. The semiconductor device according to claim 13, further comprising a second insulating film covering the first sidewall of the control gate electrode,
wherein an interface between the second insulating film and the first insulating film is separated from the end of the top of the first insulating film in the gate length direction.

* * * * *